United States Patent
Moshe et al.

(10) Patent No.: US 12,205,660 B2
(45) Date of Patent: Jan. 21, 2025

(54) TEST CONTROLLER ENABLING A SNAPSHOT RESTORE AND RESUME OPERATION WITHIN A DEVICE UNDER TEST

(71) Applicant: Western Digital Technologies, Inc., San Jose, CA (US)

(72) Inventors: Eran Moshe, Kfar Saba (IL); Pavel Teper, Kfar Saba (IL)

(73) Assignee: Sandisk Technologies, Inc., Milpitas, CA (US)

( * ) Notice: Subject to any disclaimer, the term of this patent is extended or adjusted under 35 U.S.C. 154(b) by 1 day.

(21) Appl. No.: 18/226,201

(22) Filed: Jul. 25, 2023

(65) Prior Publication Data
US 2024/0153572 A1  May 9, 2024

Related U.S. Application Data

(60) Provisional application No. 63/423,672, filed on Nov. 8, 2022.

(51) Int. Cl.
*G11C 29/12* (2006.01)
(52) U.S. Cl.
CPC .............................. *G11C 29/1201* (2013.01)
(58) Field of Classification Search
None
See application file for complete search history.

(56) References Cited

U.S. PATENT DOCUMENTS

| | | | |
|---|---|---|---|
| 7,043,416 B1 | 5/2006 | Lin | |
| 7,853,425 B1 * | 12/2010 | Williamson | G01R 31/2834 714/724 |
| 7,984,352 B2 | 7/2011 | Greb | |
| 9,785,542 B2 * | 10/2017 | Elston | G06F 11/3688 |
| 10,088,521 B2 * | 10/2018 | Yun | H01L 22/14 |
| 10,902,933 B2 | 1/2021 | Kalva et al. | |
| 11,719,749 B1 * | 8/2023 | Annepu | G06F 11/3664 702/119 |

(Continued)

OTHER PUBLICATIONS

R. Rajsuman, N. Masuda and K. Yamashita, "Architecture and design of an open ATE to incubate the development of third-party instruments," in IEEE Transactions on Instrumentation and Measurement, vol. 54, No. 5, pp. 1678-1698, Oct. 2005, (Year: 2005).*

*Primary Examiner* — Daniel F. McMahon
(74) *Attorney, Agent, or Firm* — LOZA & LOZA, LLP; Gabriel Fitch

(57) ABSTRACT

Techniques are provided for capturing a processing state snapshot of a device under test (DUT) that enable a previous test run to be restored and resumed from the same point the snapshot was taken. The techniques enable restoring the snapshot into the same or a different device to resume a previous test run. In an illustrative example, a DUT is controlled by a Joint Test Action Group (JTAG) test controller to capture a Steady State Snapshot by controlling peripheral components of the DUT to complete any on-going tasks to reach a steady state and then flush data to a memory of the DUT. The flushed steady state peripheral component data and other processing state data is transferred to the test controller for analysis and for enabling the subsequent restore and resume operation. Solid state drive (SSD) examples are provided.

21 Claims, 10 Drawing Sheets

(56) References Cited

U.S. PATENT DOCUMENTS

| | | | |
|---|---|---|---|
| 2002/0157042 A1* | 10/2002 | Krech, Jr. | G11C 29/56 714/45 |
| 2003/0100133 A1 | 5/2003 | Eidson et al. | |
| 2007/0186131 A1* | 8/2007 | Goodrich | G01R 31/2889 714/724 |
| 2009/0044058 A1* | 2/2009 | Choate | G06F 11/2236 714/40 |
| 2019/0354453 A1* | 11/2019 | Hsu | G06F 11/24 |
| 2021/0278458 A1* | 9/2021 | Su | G06F 30/34 |
| 2022/0137130 A1* | 5/2022 | Kim | G01R 31/31905 714/724 |
| 2022/0197780 A1 | 6/2022 | Peck et al. | |
| 2023/0176124 A1* | 6/2023 | Jin | G01R 31/31724 324/750.01 |
| 2024/0095137 A1* | 3/2024 | Malisic | G06F 11/27 |

* cited by examiner

TEST CONTROLLER ENABLING A SNAPSHOT RESTORE AND RESUME OPERATION WITHIN A DEVICE UNDER TEST

CROSS-REFERENCE TO RELATED APPLICATIONS

This application claims priority to and the benefit of U.S. Provisional Patent Application No. 63/423,672, filed on Nov. 8, 2022 entitled, "TEST CONTROLLER ENABLING A SNAPSHOT RESTORE AND RESUME OPERATION WITHIN A DEVICE UNDER TEST," the entire content of which is incorporated herein by reference as if fully set forth below in its entirety and for all applicable purposes.

FIELD

The subject matter described herein relates to test controllers and to devices under test (DUTs). More particularly, the subject matter relates, in some examples, to techniques for testing and debugging a data storage device such as a non-volatile memory (NVM) device.

INTRODUCTION

Data storage devices (DSDs)—such as hard disk drives (HDDs) or solid state drives (SSDs) with non-volatile memories (NVMs)—are utilized in a wide variety of devices in stationary and mobile computing environments. Examples of such devices include desktop computers, portable notebook computers, portable hard disk drives, high-definition television (HDTV) receivers, television set top boxes, video game consoles, and portable media players.

DSDs and other devices may need to be tested during development to identify problems such as design bugs within the processing code of the DSD. One tool for testing a DSD or other device under test (DUT) is Joint Test Action Group (JTAG), which, among other features, can access integrated circuits for use in debugging embedded systems or devices. For example, a test controller/debugger may be connected to a DUT to apply JTAG commands to components within the DUT to obtain run-time information to permit debugging problems.

It would be desirable to provide improvements to JTAG-based test controllers or other test and debug tools that would enable downloading snapshots of processing states from a DUT for use in subsequently restoring and resuming operations in the same or a different device. Aspects of the present disclosure are directed to these and other ends.

SUMMARY

The following presents a simplified summary of some aspects of the disclosure to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present various concepts of some aspects of the disclosure in a simplified form as a prelude to the more detailed description that is presented later.

One aspect of the disclosure provides a test controller that includes: an interface configured to connect the test controller to a device under test (DUT); and a processing system coupled to the interface. The processing system is configured to: receive an indication of a processing point within processor code for obtaining data from the DUT for use with a subsequent resume processing operation; control the DUT to run the processor code using a control processor of the DUT and perform a peripheral component task using a peripheral component of the DUT; control the DUT to complete the peripheral component task in response to the control processor advancing to the processing point in the processor code; save, or control the DUT to save, completed peripheral component task data in a memory to enable the test controller to perform the subsequent resume processing operation.

In some aspects, the test controller may be a host personal computer (PC) configured with a JTAG-based debug program, or the test controller may be a separate dedicated apparatus or device, or the test controller may be a combination of computers, devices, and/or apparatus. In some aspects, the indication of the processing point may be received from a user of the test controller and may be, for example, a point within the processing code that the user believes will provide useful debug information if processing is stopped at that point and a snapshot is taken. The peripheral component may be one of a plurality of peripheral components of the DUT, each configured to perform a peripheral component task. The DUT may be controlled to complete all pending peripheral component tasks and save all completed peripheral component task data in the memory of the DUT. In some aspects, the processing system is further configured to perform the subsequent resume processing operation by: initializing the DUT to run in a normal processing mode; restoring the data obtained from the DUT into the same DUT; and controlling the DUT to resume processing at the processing point using the restored data. In other aspects, the DUT is a first DUT, and the processing system is configured to resume the processing operations within a second DUT.

Another aspect of the disclosure provides a method for use by a test controller. The method includes: receiving an indication of a processing point within processor code for obtaining data from a DUT for use with a subsequent resume processing operation; controlling the DUT to run the processor code using a control processor of the DUT and perform a peripheral component task using a peripheral component of the DUT; controlling the DUT to complete the peripheral component task in response to the control processor advancing to the processing point in the processor code; controlling the DUT to save completed peripheral component task data to a memory; and transferring the peripheral component task data from the memory to the test controller to enable the test controller to perform the subsequent resume processing operation.

Another aspect of the disclosure provides an apparatus that includes: means for receiving an indication of a processing point within processor code for obtaining data from a DUT for use with a subsequent resume processing operation; means for controlling the DUT to run the processor code using a control processor of the DUT and perform a peripheral component task using a peripheral component of the DUT; means for controlling the DUT to complete the peripheral component task in response to the control processor advancing to the processing point in the processor code; means for controlling the DUT to save completed peripheral component task data to a memory of the DUT; and means for transferring the peripheral component task data from the memory of the DUT to the apparatus to enable the apparatus to perform the subsequent resume processing operation.

Yet another aspect of the disclosure provides a device comprising: an interface configured to connect the device to a test controller; a peripheral component; and a processing system coupled to the interface and configured to: receive an indication from the test controller of a processing point within processor code for obtaining peripheral component task data from the peripheral component for use with a subsequent resume processing operation; run the processor code while performing a peripheral component task using the peripheral component; control the peripheral component, in response to advancing to the processing point in the processor code, to complete the peripheral component task; and save completed peripheral component task data in a memory to enable the test controller to perform the subsequent resume processing operation.

DETAILED DESCRIPTION

Figure 1:
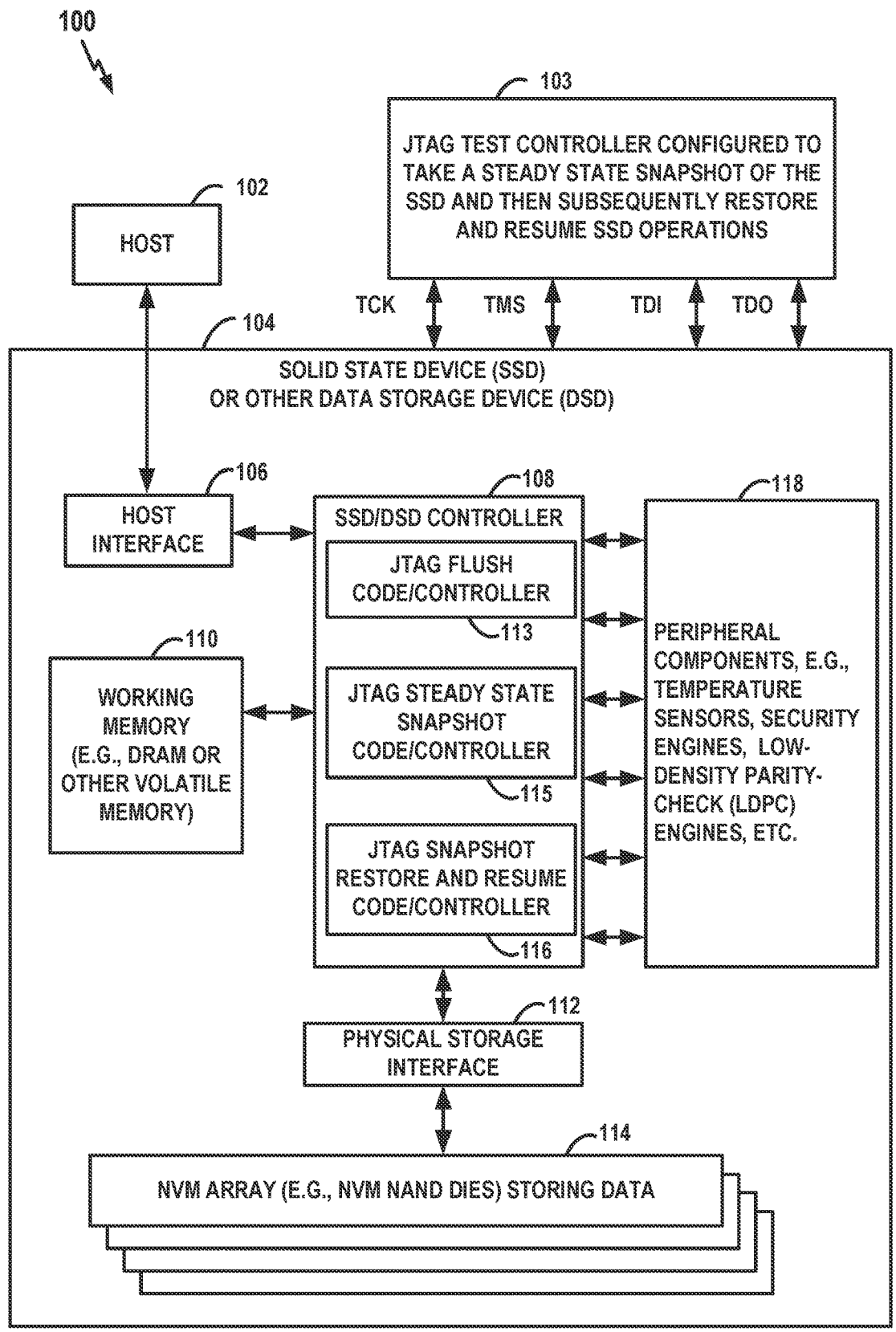
FIG. 1 is a schematic block diagram illustrating an exemplary data storage device (DSD) embodied as a solid-state device (SSD) and a JTAG Test Controller configured to capture a Steady State snapshot of the SSD and subsequently restore and resume SSD operations at the point the snapshot was captured in accordance with some aspects of the disclosure.

In the following detailed description, reference is made to the accompanying drawings, which form a part thereof. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

The examples herein primarily relate to data storage devices (DSDs) and to test controllers for testing and debugging the DSDs, wherein the test controllers are configured to use Joint Test Action Group (JTAG) features and commands to control the tests. In some aspects, the test controller may be a host personal computer (PC) configured with a JTAG-based debug program or the test controller may be a separate dedicated apparatus or device.

In the main examples described herein, the DSD includes non-volatile memory (NVM) arrays. DSDs with NVM arrays may be referred to as solid state devices (SSDs). Some SSDs use NAND flash memory, herein referred to as "NANDs." A NAND is a type of non-volatile storage technology that does not require power to retain data. It exploits negative-AND, i.e., NAND, logic. For the sake of brevity, an SSD having one or more NAND dies will be used as a non-limiting example of a DSD below in the description of various embodiments. It should be understood that at least some aspects described herein may be applicable to other forms of DSDs as well. For example, at least some aspects described herein may be applicable to phase-change memory (PCM) arrays, magneto-resistive random access memory (MRAM) arrays, and resistive random access memory (ReRAM) arrays. In still other examples, the DSD may be a hard disk drive (HDD) or a tape drive.

More generally, aspects of the disclosure relate to any device under test (DUT), which need not be a DSD but may be any of a wide variety of devices. Moreover, aspects of the disclosure are not limited to JTAG but, where appropriate, can be applied using other test protocols or systems, such as Serial Wire Debug (SWD).

Overview

JTAG is a common hardware interface that enables a debug host machine to communicate directly with the cores on a DUT, such as the computing cores of a system-on-a-chip (SoC) within a data storage controller of an SSD. The JTAG connection enables a test controller to access the DUT while the device is running. For example, a JTAG snapshot may be taken to capture certain state information of the memories, core registers, and auxiliary registers of the DUT to recreate aspects of the JTAG environment in a debug tool. The debug tool can then perform a debug procedure while taking into account the information obtained from the memories and the registers. The debug tool may provide a graphical user interface (GUI) to allow a user to examine the values to aid in debugging problems within the DUT. Although a debug can be performed in this manner, it is not currently possible to continue a previous debug test run from the same point the capture was taken, e.g., to resume operations within the DUT at the same processing code point at which the snapshot was taken. At least, the present inventors are not aware of any JTAG-based test controllers or debug tools that allow for such a JTAG-based resume operation, either within the same device or a different device.

One of the reasons that a simple JTAG snapshot generally cannot be used to resume operations is that devices may have peripheral components that include data that cannot be captured by a simple JTAG snapshot. For example, a DSD configured in accordance with Non-Volatile Memory express (NVMe) operates using a Submission Queue and a Completion Queue that are maintained within the memory of a host device. A simple JTAG snapshot of the DSD might not capture the data within the Submission and Completion Queues, and it might not be possible to properly resume DSD operations without the data in those queues first being restored. Submission and Completion Queues—as well as Submission and Completion Queue controllers within the DSD itself—may be regarded as "peripheral devices" or "peripheral components" since they are separate from the main control processor or core of the DSD.

DSDs often have a wide variety of peripheral components that have registers, buffers, or queues that, as a practical matter, cannot be captured by a simple JTAG snapshot in a manner that would allow for subsequently resuming operations at a previous capture point. For example, in some cases, peripheral components might operate off of a different clock from a main processor of the DUT. For these or other reasons, it is generally not feasible to successfully capture the full processing state of a DSD in a manner that would allow the operations of the DSD to be subsequently restored and resumed. Similar issues can arise in other DUTs besides DSDs, which have peripheral components running various tasks.

The present disclosure sets forth methods and apparatus that operate to capture a modified JTAG snapshot that allows a previous test run to be restored and resumed from the same point the snapshot was captured. In some aspects, the disclosed methods enable saving a snapshot taken from one device and then restoring the snapshot into a different device to resume a previous run in the other device from the same point the original snapshot was taken. This enables reproducing a debug scenario after restoration within the same or a different DUT. The different DUT may be a different instance of the same version/model of the original DUT.

In some aspects, a method is provided for use by a test controller coupled to a DUT. The method includes receiving an indication (e.g., from a user of the test controller via a GUI) of a processing point within processor code for obtaining data from the DUT for use with a subsequent resume processing operation. The DUT is controlled to run the processor code using a control processor of the DUT and perform peripheral tasks using peripheral components of the DUT, e.g., the DUT is controlled to run in a normal processing mode to process data. The DUT is then controlled to complete all peripheral component tasks in response to the control processor advancing to the processing point in the processor code and to save all completed peripheral component task data to a memory of the DUT. For example, a flush instruction (described below) may be placed within the processor code at the selected processing point so that when the processor of the DUT reaches that point in the code, the DUT controls its peripheral components to complete their tasks and flush their completed task data to the internal memory of the DUT. (In some aspects, a peripheral component is controlled to complete its tasks by not sending it any new tasks while allowing it time to complete tasks that are already in its command queue.) The data is then transferred from the memory of the DUT to the test controller to enable the test controller to perform the subsequent resume processing operation. For example, if the test controller is a PC running a JTAG debug program, the data may be transferred to (or backed up to) the PC. The test controller may thereafter perform the subsequent resume processing operation by; initializing the DUT; restoring the data obtained from the DUT; and controlling the DUT to resume processing operations at the selected processing point using the restored data.

Notably, by controlling the peripheral components of the DUT to complete their tasks and output (e.g., flush) their completed task data to the memory of the DUT before data is transferred to the test controller, any command queues maintained by the peripheral components are cleared out (or cleaned out) before the flush is performed. That is, the peripheral components are returned to a steady state where they have no on-going tasks before the data snapshot is taken. For the example of a DSD with NVMe, the Submission and Completion Queues are thereby emptied before the snapshot of data within the DSD is captured by the test controller. Hence, when processing operations are later resumed, they can be resumed with empty Submission and Completion Queues. Likewise, all command queues of all other peripheral components can be cleared as well prior to capturing the snapshot.

Note that, although the command queues of the peripheral components will be empty once they are in a steady processing state, the various other buffers, caches, memories or registers of the peripheral components can still hold information, which is flushed to the memory of the DUT for transference to the test controller as part of the snapshot. Thus, the flush operation does not delete data; rather the flush operation transfers data out of the peripheral components so that the data may be saved as a snapshot and later restored.

By controlling all peripheral components of a DUT to complete their tasks before data is flushed from the peripheral components, the peripheral components of the DUT (as well as the main processor of the DUT) are thereby returned to steady processing states to permit a snapshot to be captured that allows for restoring and resuming operations. (Note that, in some embodiments and depending upon the particular system, some peripheral components need not have their data flushed, or some command queues need not be cleared, and/or some particular types of commands might be cleared from queues, whereas other types of commands are not cleared. That is, in some examples, the snapshot need not capture all peripheral component data. Rather, in a given system, the snapshot should capture a sufficient amount of the data to permit restoring and resuming operations.) Herein, a "steady state" is a processing state where there are no pending commands in a peripheral component (or, in some examples, there are no pending commands in particular queues of the peripheral component), e.g., all command queues are empty (or, in some examples, selected command queues are empty). Herein, the capture taken based on data flushed while in the steady state is referred to as a Steady State Snapshot. When implemented using JTAG, the resulting capture is referred to herein as a JTAG Steady State Snapshot. The subsequent procedure that restores and resumes operations is referred to herein as JTAG Snapshot Restore and Resume procedure.

It should be understood that the "snapshot" of the JTAG Steady State Snapshot is not a simple JTAG snapshot. Rather, the JTAG Steady State Snapshot procedure operates to control (or wait for) the peripheral components of the DUT to complete their various tasks (which may take different amounts of time) before completed task data is flushed from the peripheral components. Hence, the Steady State Snapshot may comprise data obtained over a period of time from different components as those components complete their respective tasks.

In some aspects, control code is downloaded from the test controller to the DUT using a JTAG connection. For example, the code may be downloaded from a JTAG debug tool to selected processing cores of a DUT using a JTAG connection. The downloaded code includes code and data files that specify where to write the data being captured and which values to set within registers, including a Program Counter register of the main code processor of the DUT. The downloaded code is run by the main processor of the DUT and operates to collect or capture the JTAG Steady State Snapshot, which is an image of the (steady state) processing state of the DUT. After the JTAG Steady State Snapshot is obtained from the DUT by the test controller and analyzed, the user can then trigger the DUT to continue running from a previous break point by restoring the snapshot data back into the DUT and advancing the Program Counter beyond the previous break point.

Herein, control code that pertains to capturing the JTAG Steady State Snapshot is referred to as JTAG Steady State Snapshot Code. Code that pertains to subsequently restoring and resuming operations is referred to as JTAG Snapshot Restore and Resume Code. In some aspects, rather than being downloaded into the DUT for testing purposes, the code may be embodied within firmware (FW) or hardware (HW) within the DUT to facilitate JTAG testing.

Further, in some aspects, two new JTAG calls or commands are set forth herein: a Flush Command Call and Restore Call. In some aspects, before the JTAG Steady State Snapshot is captured, the Flush Command Call is applied to the DUT to cause the peripheral components of the DUT to complete their tasks and write all completed task data to the internal memory of the DUT so the components are in a steady state or "clean mode" to allow the JTAG Steady State Snapshot to be captured at a subsequent break point in the processing code. (A break point is a point in a program where the code will stop executing. A user or programmer may insert the break point into the code via a JTAG debugger.) To subsequently restore the JTAG Steady State Snapshot into the DUT, the Restore Call is applied to the DUT to load the snapshot into the DUT so that processing can then resume at the previous break point in the code (e.g., at the next instruction). That is, the captured snapshot data is restored to the various registers/memories/queues as per the above-described control code and a JTAG run is then triggered at or just beyond the break point to thereby resume operations. The JTAG Steady State Snapshot can be loaded into a different device (e.g., a different instance of the same version/model of the original DUT) to allow the JTAG run to continue in the second device.

Among other advantages, JTAG debugger users can capture a previous debug run and resume the previous run in the lab at the previous snapshot capture point. Also, users can reproduce debug scenarios after the JTAG snapshot is restored and resumed within the DUT.

Exemplary Devices, Systems and Procedures

FIG. 1 is a schematic block diagram illustrating an exemplary JTAG test controller and a DSD embodied as an SSD with the JTAG test controller configured to control the SSD to output a JTAG Steady State Snapshot and to then subsequently restore and resume SSD operations, in accordance with aspects of the disclosure. In this example, the system 100 includes a host 102, the JTAG test controller 103, and the SSD 104 (or other DSD, but for simplicity referred to as an SSD below), which is coupled to the host 102 and the JTAG test controller 103. Four interconnection lines are shown that interconnect the JTAG test controller 103 to the SSD 104: test clock (TCK), test mode select (TMS), test data input (TDI), and test data output (TDO), which may be part of an on-chip Test Access Port (TAP). The TAP is a dedicated debug port implementing a serial communications interface for low-overhead access to a DUT without requiring direct external access to the system address and data buses.

In some aspects, the JTAG controller 103 may be component of the host 102 rather than a separate device or the JTAG controller 103 may be capable of emulating the host for debug purposes. In the following descriptions, it will be assumed the test JTAG controller 103 and the host 102 are separate devices, which are both coupled to the SSD 104.

The host 102 provides commands to the SSD 104 for transferring data between the host 102 and the SSD 104. For example, the host 102 may provide a write command to the SSD 104 for writing data to the SSD 104 or read command to the SSD 104 for reading data from the SSD 104. The host 102 may be any system or device having a need for data storage or retrieval and a compatible interface for communicating with the SSD 104. For example, the host 102 may be a computing device, personal computer, portable computer, workstation, server, personal digital assistant, digital camera, or digital phone as merely a few examples.

The SSD 104 includes a host interface 106, an SSD or DSD controller 108, a working memory 110 (such as dynamic random access memory (DRAM) or other volatile memory), a physical storage (PS) interface 112 (e.g., flash interface module (FIM)), and an NVM array 114 having one or more dies storing data. The host interface 106 is coupled to the SSD controller 108 and facilitates communication between the host 102 and the SSD controller 108. The SSD controller 108 is coupled to the working memory 110 as well as to the NVM array 114 via the PS interface 112. The host interface 106 may be any suitable communication interface, such as an NVMe interface, a Universal Serial Bus (USB) interface, a Serial Peripheral (SP) interface, an Advanced Technology Attachment (ATA) or Serial Advanced Technology Attachment (SATA) interface, a Small Computer System Interface (SCSI), an IEEE 1394 (Firewire) interface, or the like. In some embodiments, the host 102 includes the SSD 104. In other embodiments, the SSD 104 is remote from the host 102 or is contained in a remote computing system communicatively coupled with the host 102. For example, the host 102 may communicate with the SSD 104 through a wireless communication link. The NVM array 114 may include multiple dies.

In some examples, the host 102 may be a laptop computer with an internal SSD and a user of the laptop may wish to playback video stored by the SSD. In another example, the host again may be a laptop computer, but the video is stored by a remote server.

Although, in the example illustrated in FIG. 1, SSD 104 includes a single channel between SSD controller 108 and NVM array 114 via PS interface 112, the subject matter described herein is not limited to having a single memory channel. For example, in some NAND memory system architectures, two, four, eight or more NAND channels couple the controller and the NAND memory device, depending on controller capabilities. In any of the embodiments described herein, more than a single channel may be used between the controller and the memory die, even if a single channel is shown in the drawings. The SSD controller 108 may be implemented in a single integrated circuit chip and may communicate with different layers of memory in the NVM 114 over one or more command channels.

The SSD controller 108 controls operation of the SSD 104. In various aspects, the SSD controller 108 receives commands from the host 102 through the host interface 106 and performs the commands to transfer data between the host 102 and the NVM array 114. Furthermore, the SSD controller 108 may manage reading from and writing to working memory 110 for performing the various functions effected by the controller and to maintain and manage cached information stored in the working memory 110.

The SSD controller 108 may include any type of processing device, such as a microprocessor, a microcontroller, an embedded controller, a logic circuit, software, firmware, or the like, for controlling operation of the SSD 104. In some aspects, some or all of the functions described herein as being performed by the SSD controller 108 may instead be performed by another element of the SSD 104. For example, the SSD 104 may include a microprocessor, a microcontroller, an embedded controller, a logic circuit, software, firmware, ASIC, or any kind of processing device, for performing one or more of the functions described herein as being performed by the SSD controller 108. According to other aspects, one or more of the functions described herein as being performed by the SSD controller 108 are instead performed by the host 102. In still further aspects, some or all of the functions described herein as being performed by the SSD controller 108 may instead be performed by another element such as a controller in a hybrid drive including both non-volatile memory elements and magnetic storage elements.

The SSD controller 108 is shown to include a JTAG Flush code/controller 113, which in some aspects comprises control code loaded into the SSD 104 to facilitate, enable, or implement the aforementioned JTAG Flush Command Call or may comprise corresponding FW or HW. In some aspects, the JTAG test controller 103 in conjunction with the JTAG Flush code/controller 113 functions to perform or control the aforementioned JTAG Flush operations in which peripheral components are caused to complete their tasks and flush all (or at least some) data to internal memory 110. The SSD controller 108 is also shown to include a JTAG Steady State Snapshot code/controller 115, which in some aspects comprises the aforementioned JTAG Steady State Snapshot control code that is loaded into the SSD 104 to facilitate, enable, or implement the JTAG Steady State Snapshot or may comprise corresponding FW or HW. In some aspects, the JTAG test controller 103 in conjunction with the JTAG Steady State Snapshot code/controller 115 functions to perform or control the aforementioned JTAG Steady State Snapshot operations. The SSD controller 108 is further shown to include a JTAG Snapshot Restore and Resume code/controller 116, which in some aspects comprises control code loaded into the SSD 104 to facilitate, enable, or implement the Snapshot Restore and Resume operations or may comprise corresponding FW or HW. In some aspects, the JTAG test controller 103 in conjunction with the JTAG Snapshot Restore and Resume code/controller 116 functions to perform or control the aforementioned JTAG Restore and Resume operations.

In one aspect, the controllers 113, 115 and 116 are modules within the SSD controller 108 controlled by software or firmware. In one aspect, the controllers 113, 115 and 116 may be separate components from the SSD controller 108 and may be implemented using any combination of hardware, software, and firmware (e.g., like the implementation options described above for SSD controller 108) that can perform the operations as will be described in further detail below. In one example, the controllers 113, 115 and 116 are implemented using one or more firmware algorithms or other sets of instructions that can be performed on the SSD controller 108 to implement functions described below.

FIG. 1 also illustrates peripheral components 118, which may include, for example, various sensors (such as temperature sensors), security engines (e.g., cyclic redundancy check engines), low-density parity-check (LDPC) engines, etc. The JTAG Flush Command Call serves to control all of the peripheral components 118 to complete their peripheral tasks and write out their completed task data to the working memory 110 so that the JTAG Steady State snapshot can be taken. It should be noted that at least some of the other components shown in FIG. 1 are also peripheral components, such as the host interface 106, PS interface 112, etc. A more complete listing of peripheral components is provided below.

The working memory 110 may be any suitable memory, computing device, or system capable of storing data. For example, working memory 110 may be ordinary RAM, DRAM, double data rate (DDR) RAM, static RAM (SRAM), synchronous dynamic RAM (SDRAM), a flash storage, an erasable programmable Read Only-memory (EPROM), an electrically erasable programmable ROM (EEPROM), or the like. In various embodiments, the SSD controller 108 uses the working memory 110, or a portion thereof, to store data during the transfer of data between the host 102 and the NVM array 114. For example, the working memory 110 or a portion of the volatile memory 110 may be a cache memory. The NVM array 114 receives data from the SSD controller 108 via the PS interface 112 and stores the data. In some embodiments, working memory 110 may be replaced by a non-volatile memory such as MRAM, PCM, ReRAM, etc. to serve as a working memory for the overall device.

The NVM array 114 may be implemented using NAND flash memory. In one aspect, the NVM array 114 may be implemented using any combination of NAND flash, PCM arrays, MRAM arrays, and/or ReRAM. In one example, six NAND flash chips are provided. The PS interface 112 provides an interface to the NVM array 114. For example, in the case where the NVM array 114 is implemented using NAND flash memory, the PS interface 112 may be a flash interface module. In one aspect, the PS interface 112 may be implemented as a component of the SSD controller 108. In the example of FIG. 1, the SSD controller 108 may include hardware, firmware, software, or any combinations thereof that provide functionality.

Although FIG. 1 shows an exemplary SSD and an SSD is generally used as an illustrative example in the description throughout, the various disclosed embodiments are not necessarily limited to an SSD application/implementation. As an example, the disclosed NVM array and associated processing components can be implemented as part of a package that includes other processing circuitry and/or components. For example, a processor may include, or otherwise be coupled with, embedded NVM array and associated circuitry. The processor could, as one example, off-load certain operations to the NVM and associated circuitry and/or components. As another example, the SSD controller 108 may be a controller in another type of device and still be configured to perform or control some or all of the other functions described herein.

JTAG Steady State Snapshot with Restore and Resume

Figure 2:
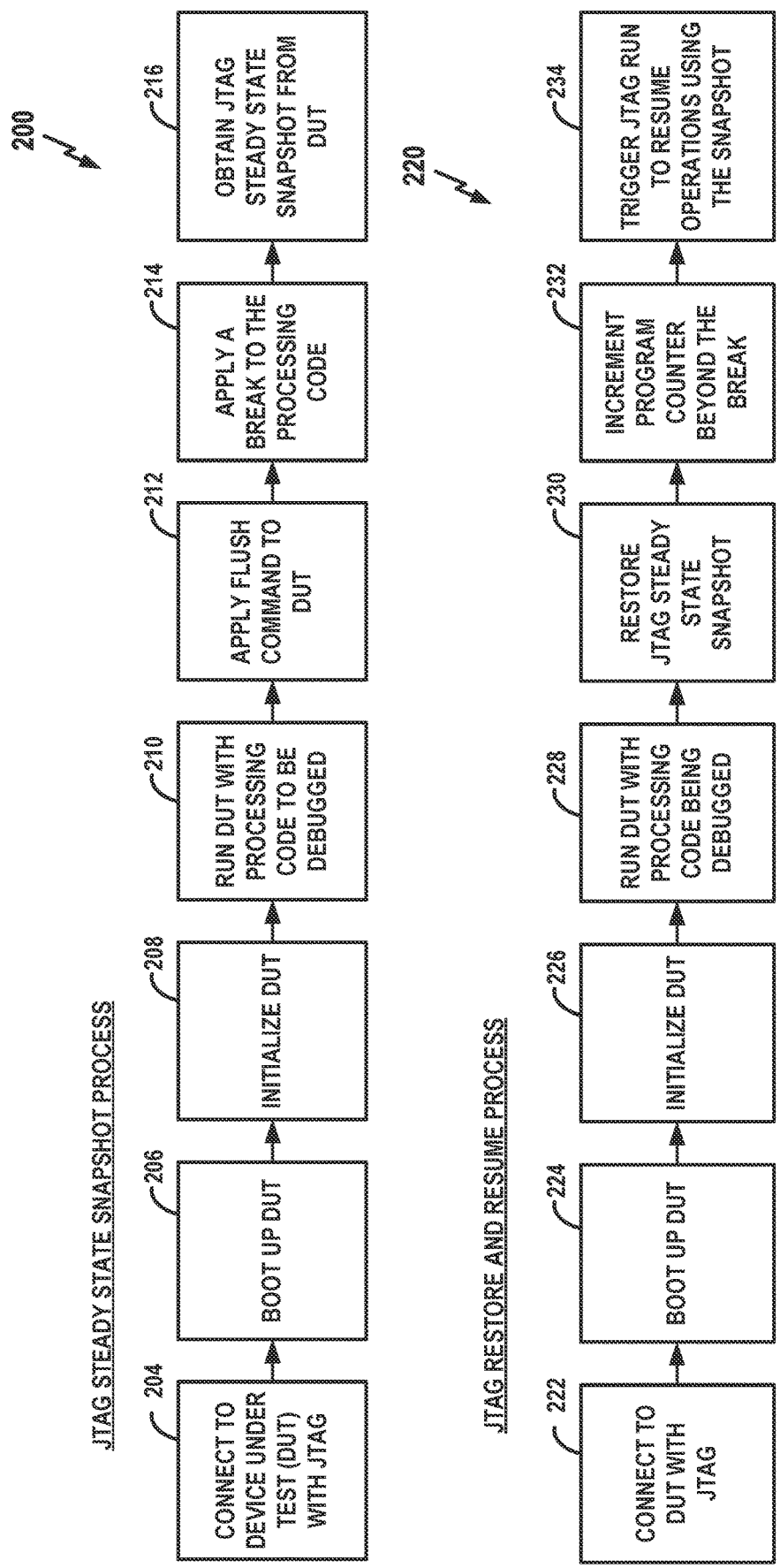
FIG. 2 illustrates a procedure for obtaining a JTAG Steady State Snapshot from a device under test (DUT) and for subsequently restoring the snapshot and resuming operations in accordance with some aspects of the disclosure.

FIG. 2 illustrates a method or process 200 for obtaining a JTAG Steady State Snapshot from a DUT and a method or process 220 for subsequently restoring the snapshot into the same DUT (or a different DUT) to resume operations. Beginning at block 204, a JTAG controller is connected to a DUT. For example, a test engineer operating the JTAG controller may connect a JTAG control cable into a JTAG TAP on the printed circuit board of the DUT. Although not shown in FIG. 2, the DUT may also be connected to a host computer, if the DUT is intended to operate with a host. In some cases, depending upon the particular DUT and the particular host, the JTAG controller may be configured to emulate the operations of a host for debugging purposes. At block 206, the DUT is booted up under the control of the JTAG controller. (The boot entry point may be configured to set or reset the vector address to 0x0, from which the DUT starts the boot process.) In other examples, depending upon the particular DUT and the particular JTAG controller, the DUT may be booted up independently of the JTAG controller such as by, for example, manually activating an on/off switch on the device.

At block 208, the DUT is initialized under the control of the JTAG controller. In other examples, again depending upon the particular DUT and the particular JTAG controller, the DUT may be initialized independently of the JTAG controller, e.g., under the control of a separate host. Initialization may include loading compiled software or FW code into the DUT. The software may include program control software that runs on a core processor of the DUT and may include the software to be debugged as part of the JTAG process. The software may include JTAG debug instructions, calls, or commands, such as break( ) instructions or the like, set by a user at selected points within the code (where, in some aspects, the "( )" may represent parameters to be provided along with the instruction). For example, a breakpoint (or watchpoint) may be set at a point in the code that the user has selected (via a GUI of a debug tool of the test controller). For instance, the user selects a point in the code that the user believes will provide useful debug information if processing is stopped at that point and a snapshot then captured. In some examples, the software may include a JTAG_Snapshot_Flush_Process( ) instruction or command to implement the above-described JTAG Flush Command Call.

Initialization may also include setting up various queues and management tables, such as flash translation layer (FTL) tables, if the DUT is an SSD. Initialization may further include formatting memory arrays. If the DUT operates in connection to a host, initialization may include setting up host bus connections. If the DUT is an NVMe-based SSD, initialization may include setting up Submission and Completion Queues in host memory. Initialization procedures may vary depending upon the particular DUT.

At block 210, the JTAG controller controls the DUT to run in accordance with the installed processing code. In other examples, again depending upon the particular DUT and the particular JTAG controller, the DUT may be run automatically following boot up and initialization. While the processing code runs, a program counter is incremented. The program counter may be a register that holds the address of the program instruction that is being executed at the current time. As each instruction is fetched and processed, the program counter increases by 1 so the program counter then points to the next instruction in the sequence. At block 210, the DUT runs in a normal processing mode, which may include processing host commands for reading and writing data from an NVM array (if the DUT is an SSD).

At block 212, the Flush Command is applied to the DUT. In examples where the Flush Command is embodied in compiled code running within the DUT, e.g., using JTAG_Snapshot_Flush_Process( ) instruction, the Flush Command is applied automatically when the program code reaches the Flush Command instruction. In other examples, the JTAG test controller applies the Flush command to the DUT by sending a message or issuing a command to the DUT via Universal Asynchronous Receiver-Transmitter (UART) or other suitable protocol, which the core processor of the DUT then processes and responds to. In still other examples, the Flush Command is embodied as external code that is loaded into the DUT. As explained above, the Flush Command operates to cause the various peripheral components of the DUT to complete their tasks by processing all of the commands in their input command queues (including handling any messages from external devices to be processed) to reach a steady state and then flush (e.g., write) all internal data from their buffers, registers, caches, etc., to an internal memory of the DUT (such as the working memory 110 of FIG. 1).

At block 214, the break (e.g., a JTAG breakpoint or watchpoint) is applied to the DUT to pause, suspend, halt, or stop its processing. In examples where the break is embodied in compiled code running within the DUT, e.g., using a break( ) instruction, the break is applied automatically when the program code reaches the break instruction. In other examples, the JTAG test controller applies the break by sending a suitable command to the DUT. The manner by which the break is applied may depend on the particular debugging mode that the JTAG controller is using. For halt mode debugging, the debugger of the JTAG controller may trigger the watchpoint or breakpoint in the DUT as the user steps through instructions.

At block 216, in some examples, the test controller then applies a suitable JTAG command to obtain a snapshot representative of all data in the internal memory (and all data in an NVM if the DUT includes an NVM). Since the peripheral components were already allowed to complete their tasks and return to a steady state before data was flushed from the peripheral components (at block 212), the resulting snapshot is a JTAG Steady State Snapshot, which permits subsequently restoring and resuming operations in the same or a different DUT. Depending upon the particular DUT and the particular JTAG controller, rather than having the JTAG controller apply a command to the DUT during debugging to capture and transfer the JTAG Steady State Snapshot, a suitable instruction may be provided within the compiled software or FW loaded into the DUT.

In an illustrative example, the procedure 200 may be summarized as follows:
  Connect Device with JTAG
  Device First Boot
  Device Initializations
  Device Running (Normal State)
  // Processing code reaches point (e.g., instruction) previously selected by user to take JTAG Steady State Snapshot capture
  JTAG_Snapshot_Flush_Process( )
  Break( );
  Take JTAG Steady State Snapshot
  // Snapshot is saved to file, e.g., JTAG_Steady_State_Snapshot.file In the illustrative example, the following pseudocode represents the JTAG_Snapshot_Flush_Process:
  JTAG_Snapshot_Flush_Process( )
    For all Peripherals [0 . . . N] wait until reaching Steady State (i.e., there are no waiting commands in Command Queues of the Peripherals)
    Handle Peripherals[i]->Save Data from Peripheral memory/registers including processing any pending tasks/messages.

Turning now to the process 220 for restoring the snapshot into the same DUT (or a second, different DUT) to resume operations, the JTAG controller, at block 222, is connected to the same DUT or a second DUT. The second DUT may be a different instance of the same version/model of the first DUT of the snapshot procedure 200. That is, the second DUT may be structurally the same as the first DUT, with the same hardware components, sensors, etc., but with a different device serial number. At least, the second DUT needs to be sufficiently similar to the first DUT so it can run the same processor code being debugged. Although not shown in FIG. 2, the DUT may be connected to a host computer. At block 224, the DUT is booted up, e.g., under the control of the JTAG controller and, at block 226, the DUT is initialized, e.g., under the control of the JTAG controller, including loading compiled code. In other examples, as noted above, depending upon the particular DUT and the particular JTAG controller, the DUT may be booted up and initialized independently of the JTAG controller.

At block 228, the DUT is controlled to run in accordance with the processing code that is being debugged (which is installed during initialization block 226). Note here that the processing code of procedure 220 may be different from the processing code installed in the DUT during procedure 200, particularly if the processing code has been corrected to fix bugs in the code or otherwise has been modified, perhaps to add or remove functional features. The program counter is again incremented as processing proceeds. At block 230, in some examples, the test controller applies the aforementioned JTAG Restore Call to restore the JTAG Steady State Snapshot into the DUT. (If the DUT of procedure 220 is a second DUT, the JTAG Restore Call operates to load the JTAG Steady State Snapshot into that second DUT.) For instance, JTAG signals may be used to stop processing by the DUT so that the JTAG Restore Call may be applied by the JTAG debugger to the DUT.

As explained above, the Restore command operates to load all of the snapshot data into the various buffers, registers, caches, etc., of the DUT, including the buffers, registers, caches, etc., of the peripheral devices. (This may involve overwriting and replacing any data that might be currently saved in those components.) As already explained, the JTAG Steady State Snapshot is captured during procedure 200 with all of the peripheral components in a steady state in which there are no commands in their command queues That is, in this example, all peripheral component commands have been processed. Nevertheless, various other queues, buffers, registers, etc., of the peripheral components may have data to be restored. Furthermore, as discussed above, in some examples and depending upon the system, not all command queues may need to be cleared and/or not all command types may need to be cleared. For example, a distinction might be drawn between pending commands and in-progress commands. For a given system, the snapshot should capture a sufficient amount of the data to permit restoring and resuming operations but need not capture all data. Note also here that processing can be paused at block 230 at any time and during any instruction since the processing state will be restored so that processing can resume after the break point previously used to obtain the JTAG Steady State Snapshot captured during procedure 200.

At block 232, the test controller increments (or otherwise sets) the program counter of the DUT to the next instruction within the processing code beyond the processing code break point previously applied at block 214. This allows processing to resume following the break point that was used to capture the snapshot so as to skip (e.g., arrive at and then advance just beyond) the break. At block 234, the JTAG test controller then triggers the DUT to resume operations from that point in the code using the restored data as part of a new JTAG run. In this manner, for example, a user of the JTAG test controller may determine whether a change within the processing code being debugged successfully fixed the problem. As can be appreciated, the procedures 200 and 220 of FIG. 2 can be repeated as needed with different break points chosen by the user within the code to take snapshots of different processing states to aid in debugging the code. By enabling the JTAG test controller to restore and resume operations within a second, different device, the procedure may allow the user to identify problems arising from flaws in the hardware, rather than bugs in the programming code, or to achieve other goals or advantages.

In an illustrative example, the procedure 220 may be summarized as follows:
Connect Device with JTAG
Device First Boot
Device Initializations
Device Running (Normal State)
// Stop processing at any point, then Run JTAG debugger to download JTAG_Steady_State_Snapshot.file
JTAG Snapshot Restore (to restore all memories and registers)
Increase Program Counter register to next instruction to skip the Break( );
Continue running under JTAG
// Device resumes operations from break point where snapshot was taken.

Figure 3:
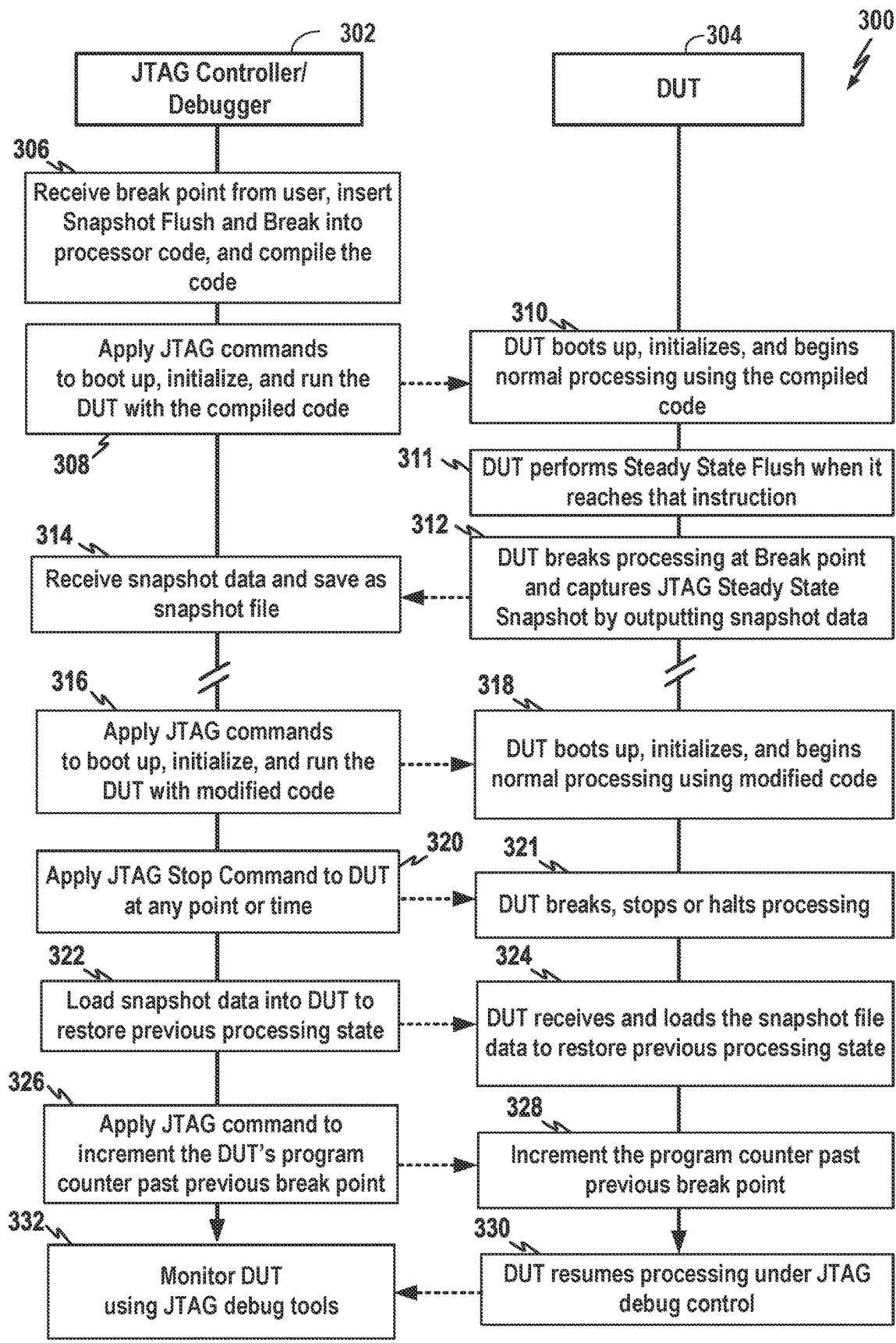
FIG. 3 is a flowchart illustrating operations performed by a JTAG test controller and a DUT, in accordance with some aspects of the disclosure.

FIG. 3 provides a flowchart 300 illustrating an exemplary sequence of operations performed by components of a system that includes a JTAG controller/debugger 302 and a DUT 304, which may be a DSD, such as an SSD or HDD. Operations performed by the JTAG controller/debugger 302 are shown on the left. Operations performed by the DUT 304 are shown on the right.

Beginning at 306, the JTAG controller/debugger 302 receives an indication of a break point from user. For example, the user selects a point in the code that the user believes will provide useful debug information if processing is stopped at that point and a snapshot then taken. The selection may be made, for example, using a GUI of the JTAG controller/debugger 302. Also, at 306, under the control of the user, the JTAG controller/debugger 302 inserts a JTAG_Snapshot_Flush_Process( ) command and a break( ) command into the code at the selected point, and then compiles the code for loading into the DUT. Any code needed to implement the JTAG_Snapshot_Flush_Process( ) may also be inserted into the code, e.g., as a subroutine that can be called and executed.

At 308, the JTAG controller/debugger 302 applies JTAG commands to the DUT to boot up, initialize, and run the DUT with the compiled code. As explained above, initialization may involve various steps and operations, including loading the compiled code into the DUT.

At 310, the DUT boots up, initializes (including receiving and loading the compiled code), and begins normal processing using the compiled code. A program counter is advanced as each instruction in the code is executed.

At 311, the DUT performs a JTAG Steady State Flush when it reaches the JTAG_Snapshot_Flush_Process( ) instruction or command in the execution of the processing code. As already explained, the Steady State flush may involve executing code that causes the peripheral components of the DUT to complete their tasks and clear their command queues so that there are no pending tasks, messages, etc. The peripheral components are then each in a steady state. Once in the steady state, the Steady State Flush then flushes (e.g., writes) any data from the various queues, buffers, registers, caches, etc., of the peripheral components to the volatile memory of the DUT for use in creating the JTAG Steady State Snapshot. In some examples, the code causes the peripheral components of the DUT to complete their tasks by blocking any new tasks or commands (or not sending any new tasks or commands) while allowing the peripherals time to complete all tasks already been assigned. Hence, aspects of controlling a peripheral component to complete its tasks include waiting for the component to complete pending tasks in due course. In other examples, depending on the peripheral, the code may force the peripheral to complete its tasks immediately or as soon as possible.

At 312, the DUT breaks processing (e.g., pauses, halts, or stops its processing) when the core processor reaches the break point instruction in the code. The DUT then captures the JTAG Steady State Snapshot by outputting all data from the volatile memory, including all flushed peripheral component data and, in some examples, all data from NVM NAND arrays.

At 314, the JTAG controller/debugger 302 receives snapshot data and saves it as a snapshot file for analysis by the user during, e.g., offline debugging, and to enable a subsequent Restore and Resume operation.

Note that operations of 306-314 comprise the JTAG Steady State Snapshot procedure (e.g., procedure 200 of FIG. 2). Sometime later, typically after the snapshot data has been analyzed by the user to debug the processing code, and the code has been edited or modified to correct any errors, the user initiates the Restore and Resume procedure.

At 316, under the control of the user, the JTAG controller/debugger 302 applies JTAG commands to boot up, initialize, and run the DUT with the modified (corrected) code.

At 318, the DUT boots up, initializes, and begins normal processing using the modified (corrected) code.

At 320, under the control of the user, the JTAG controller/debugger 302 applies a JTAG Stop Command to DUT. The stop may be applied at any point or time during the operations of the DUT since the processing state will be restored to enable processing to resume after the break point previously used to obtain the JTAG Steady State Snapshot at 312.

At 321, the DUT halts processing in response to the stop command.

At 322, under the control of the user, the JTAG controller/debugger 302 loads the snapshot data into DUT to restore the previously-saved processing state.

At 324, the DUT receives and loads the snapshot file data to restore previous processing state. This includes restoring all flushed data back into the peripheral components to return them to their steady state processing state.

At 326, the JTAG controller/debugger 302 applies a JTAG command to increment the DUTs program counter past previous break point to thereby set or reset the program counter to the next instruction within the processor code.

At 328, the DUT responds by incrementing its program counter past the previous break point to thereby skip the previous break.

At 330, the DUT resumes processing under JTAG debug control.

At 332, the JTAG controller/debugger 302, under the control of the user, monitors the DUT using JTAG debug tools to, e.g., verify that any changes to the processing code successfully fixed any bugs or other errors in the code.

Note that operations of 316-332 comprise the JTAG Restore and Resume procedure (e.g., procedure 220 of FIG. 2).

FIG. 3 thus illustrates an example where JTAG commands or instructions that enable the JTAG Steady State Snapshot and the JTAG Restore and Resume are inserted into processing code that is compiled and loaded into a DUT. As noted, in other examples, other procedures or techniques may be used, such as sending commands to the DUT via a UART.

Insofar as NVM NAND arrays are concerned, the amount of data in the NAND arrays might be quite large and so special provisions may be provided to avoid the need to save all of the NAND data as part of a snapshot or to at least make the capture of NAND data more efficient. One NAND-based option, for example, operates to format the NAND before the snapshot is captured (at 312) to thereby bypass the copying of the NAND content. For example, a suitable Format NAND instruction may be inserted into the processing code before the JTAG_Snapshot_Flush_Process( ) instruction. Similarly, the NAND may be formatted using suitable commands prior to Restoring the Snapshot (at 324).

In another NAND-based option, to speed up the capture of NAND data, a Peripheral Component Interconnect Express (PCIe) interface may be used (assuming the DUT is so equipped) to read NAND blocks directly to an external disk (e.g., an external HDD). Suitable commands or instructions may be provided in the processing code to initiate the transfer via PCIe. Then, during the subsequent Restore procedure, the NAND may be formatted first and then the data saved on the HDD is loaded into the NAND via PCIe using physical writes during which bad blocks on the NAND are skipped. For example, bad blocks may be detected during the formatting operation with a list of the bad blocks saved in a bad block module (BBM) table. In other examples, the bad blocks may already be listed in a BBM table that has been captured as part of the Snapshot. During the transfer of the data from the HDD to the NAND, the BBM table can be accessed to skip the bad blocks. If the data is being loaded into a different NAND device, a BBM relink table (or similar table) may be modified if needed to account for differences in bad blocks between the first DUT (from which the NAND data was captured) and the second DUT (into which the data is to be loaded). Note here that, in a multi-plane NAND, good blocks on different planes may be linked for writing data with a high degree of parallelism. Bad blocks can result in unlinked blocks and so relinking may be useful.

Figure 4:
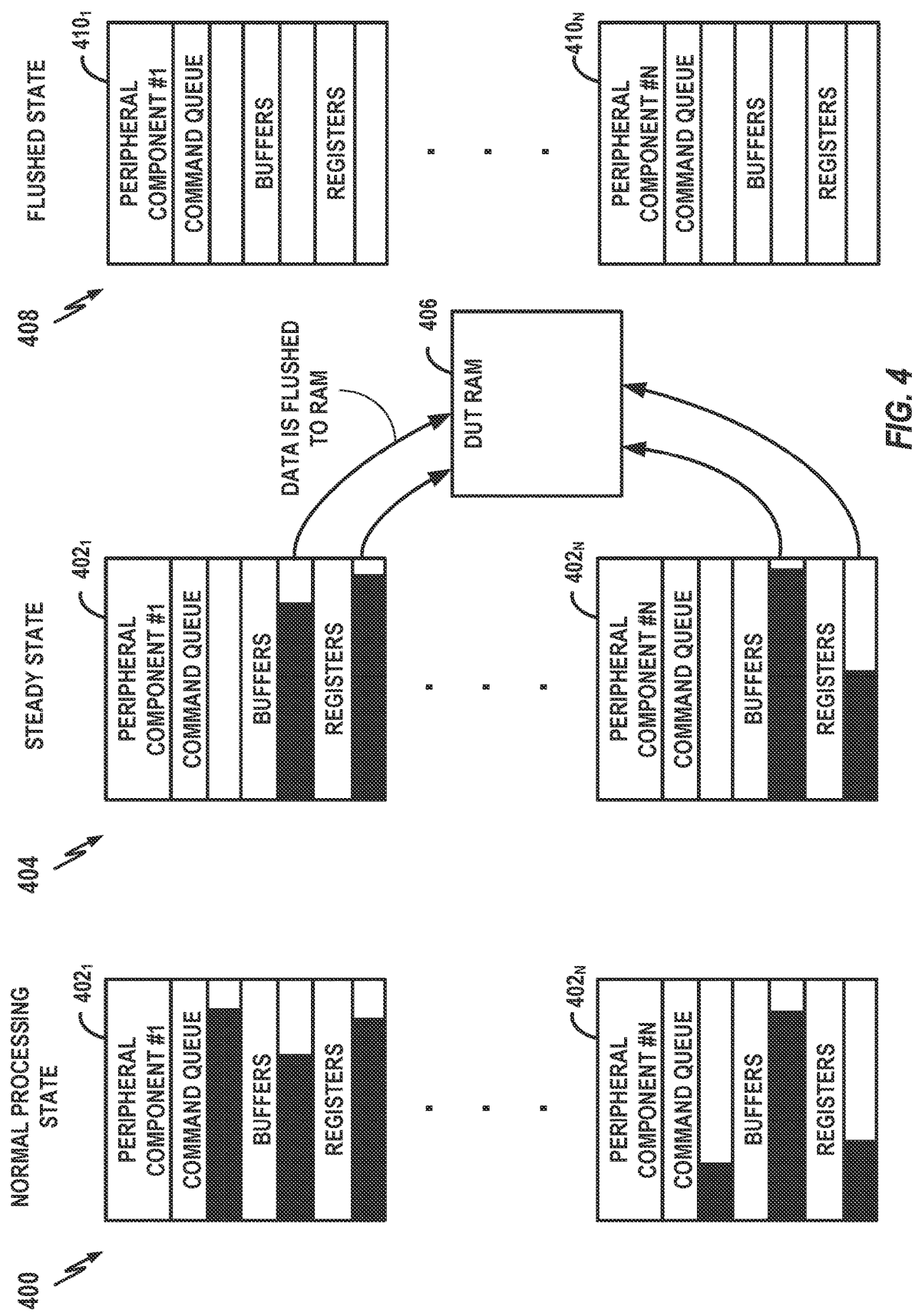
FIG. 4 graphically illustrates a JTAG Steady State Flush process, in accordance with some aspects of the disclosure.

FIG. 4 graphically illustrates and summarizes the JTAG Steady State Flush process. At 400, a set of peripheral components $402_1$-$402_N$ are in a normal (active) processing state (as in block 210 of FIG. 2 or step 310 of FIG. 3) where the components are processing various commands in their command queues. The buffers and registers of the peripheral components thus typically have some amount of data. In FIG. 4, the amount of data within the queues, buffers, and registers of the peripheral components is shown by way of black bars that represent the relative amount of data. The command queue of peripheral component $402_1$ is mostly, but not completely, full. The command queue of peripheral component $402_N$ is less full.

At 404, the peripheral components $402_1$-$402_N$ have reached the above-described steady state where they have completed processing any commands in their command queues. At this point, there can still be data within the buffers and registers of the peripheral components that needs to be flushed to the RAM 407 of the DUT to capture the JTAG Steady State Snapshot. Arrows within FIG. 4 illustrate the transference of data from buffers and registers of the peripheral components to the RAM as part of the flush process.

At 408, the peripheral components $402_1$-$402_N$ have reached a flushed state where all command queues, buffers and registers (and any other memory components) are empty. At this point, the data flushed to the DUT RAM can be transferred to the JTAG controller to complete the JTAG Steady State Snapshot.

As already explained, the snapshot can be analyzed by users off-line and then employed to restore and resume processing in the same or another device. Although not shown in FIG. 4, during the subsequent restore process, the data flushed out of the peripheral components is loaded back into the peripheral components to return those components to their previous steady state to permit resumption of processing at the point the snapshot was taken.

Exemplary SSD Embodiments

Figure 5:
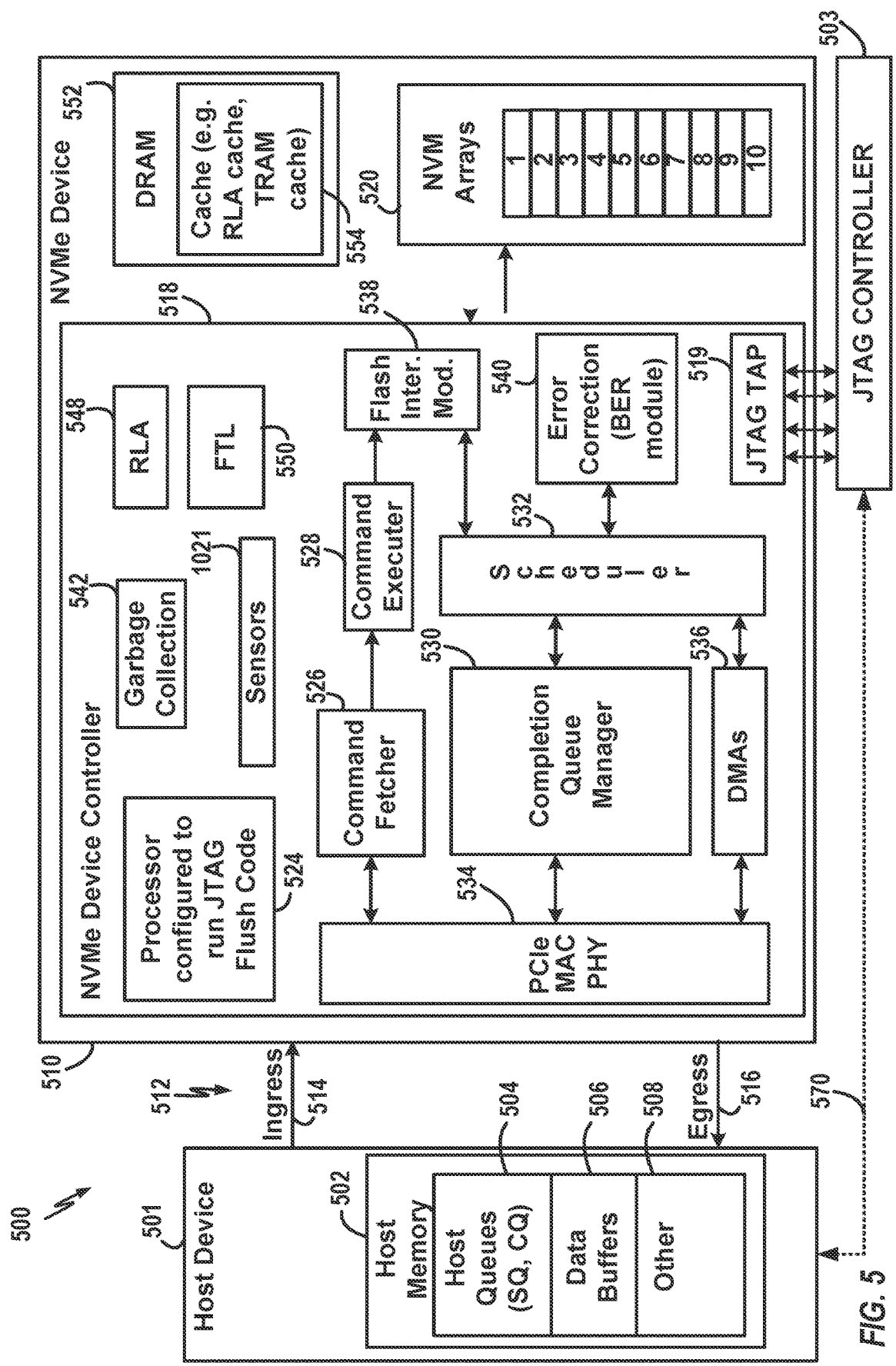
FIG. 5 is a schematic block diagram illustrating an exemplary data storage system with a NVM express (NVMe) device controller, in accordance with some aspects of the disclosure.

FIG. 5 is a schematic block diagram illustrating an exemplary system 500 with an NVMe device 510 that has a controller 518 configured to operate in conjunction with a JTAG controller or debugger 503, in accordance with some aspects of the disclosure. A JTAG TAP interface 519 is shown, which may have standard JTAG terminal connections (TCK, TMS, TDI, and TDO).

In this example, the system 500 also includes a host device 501 that may be any suitable computing or processing platform capable of accessing memory on an NVM data storage device to write data using NVMe procedures. (In some examples, the JTAG controller 503 might be configured to emulate the host so a separate host is not used or the host may be a PC running a JTAG debug program so that a separate JTAG controller is not used.) The host device 501 includes internal host memory 502, which in this example is DRAM. The host memory 502 may be configured to include, as shown, various host submission queues (SQs) and completion queues (CQs) 504, data buffers 506 and other memory components 508. The host device 501 may store data in the NVMe storage device 510. The NVMe device 510 may be any suitable device that provides non-volatile memory storage for host device 501 in accordance with NVMe standards. For example, the NVMe device 510 may be a removable storage device, such as a flash SSD that is removably connectable to host device 501. In another example, the NVMe device 510 may be non-removable or integrated within the host device 501. In some embodiments, the host device 501 and the NVMe device 510 are communicatively connected via a PCIe bus 512 (including ingress 514 and egress 516).

The NVMe storage device 510 of FIG. 5 includes an NVMe controller 518 and a non-volatile memory 520. The NVMe controller 518 controls access to the non-volatile memory 520 such as a NAND. The NVMe controller 518 thus may be a non-volatile memory controller that implements or supports the NVMe protocol, and the non-volatile memory 520 may be implemented with two dimensional (2D) or three dimensional (3D) NAND flash memory. The NVMe controller includes a processor 524 configured to control operations of the device 510 by running processor code loaded into the processor 524 by the JTAG controller 503. For example, the code may have the aforementioned JTAG commands or instructions for implementing a JTAG Steady State Snapshot, such as the JTAG_Snapshot_Flush_Process( ) instruction and the break( ) instruction. The processor 524 is also responsible for the execution of various front-end and back-end tasks. (Multiple processors may also be provided.)

In operation, during normal processing, a command fetcher 526 of the NVMe controller 518 fetches commands, such as read requests for data, from the submission queues within the host memory 502 and forwards the commands to a command executer 528. The command fetcher 526 is responsible for fetching and parsing the commands from the host and queuing them internally, and may form part of a front end of the NVMe controller 518. The command executer 528 is responsible for arbitrating and executing the commands. Upon completion of the commands, the NVMe controller 518 generates completion entries that are ultimately directed to the completion queues within the host memory 502. A completion queue manager 530 is responsible for managing the host completion queues. Among other functions, the completion queue manager 530 routes completion entries received from a scheduler 532 to a completion queue within the host device 501 via a PCIe/MAC/PHY interface 534.

Actual streams of data (obtained as the result of read commands applied to the NVM memory arrays 520) are delivered to the host device 501 using one or more DMAs 536. Additional components of the NVMe controller 518 shown in FIG. 5 include a FIM 538, which is responsible for controlling and accessing the memory arrays 520, and an error correction code (ECC) component 540, which includes a bit error rate (BER) module.

Additional components of the NVMe controller 518 include: a sensor 521 (such as a temperature sensor), a garbage collection module 542 for controlling garbage collection and related tasks; a read look ahead (RLA) controller 548; and an FTL 550. Note that some of these components may be part of the FIM 538 but are shown separately for the sake of completeness and convenience. The NVMe storage device 510 may additionally include a DRAM 552 (or other working memory), which may include a cache 554.

In one aspect, each of the components in the device 510 other than the processor 524 are peripheral components or peripheral devices. As explained above, during JTAG debugging, the various peripheral components may be controlled to complete their tasks so that their command queues (or related queues) are emptied and the peripheral components are put into a steady state. The above-described JTAG_Snapshot_Flush_Process( ) operates to flush data out of the various registers and memories of the peripheral devices to an internal volatile memory, such as DRAM 552, for outputting to the JTAG controller/debugger 503 for debugging and for use in a subsequent JTAG Restore and Resume operation. Steady State Flush code loaded into the processor 524 may perform the flush operations. The processor 524 is controlled during debugging by the JTAG controller 503 via JTAG interface 519 or via messages/commands sent to the NVMe device 510 from the JTAG controller 503 using the PCIe/MAC/PHY interface 534 (with the messages/commands sent via, e.g., an optional connection 570 between the JTAG controller 503 and the host device 501).

Insofar as the peripheral components are concerned, some exemplary peripheral components are illustrated in FIG. 5 such as PCIe/MAC/PHY interface 534 (including NVMe Submission/Completion Queues 504); Sensors 521; DMA 536; and the NVM (NAND) array 520. Other peripheral components may include: a Serial Peripheral Interface (SPI); UART components; a DDR Controller; an Inter-Integrated Circuit ($I^2C$)/Improved Inter-integrated Circuit ($I^3C$)/System Management Bus (SMBus); a general purpose IO (GPIO); Security Engines such as Advanced Encryption Standard (AES), secure hash algorithm (SHA), and CRC; Internal Buffers; LDPC engines; an Inter-Processor Communication (IPC) device; and any other components providing a connection to devices external to the NVMe device.

Figure 6:
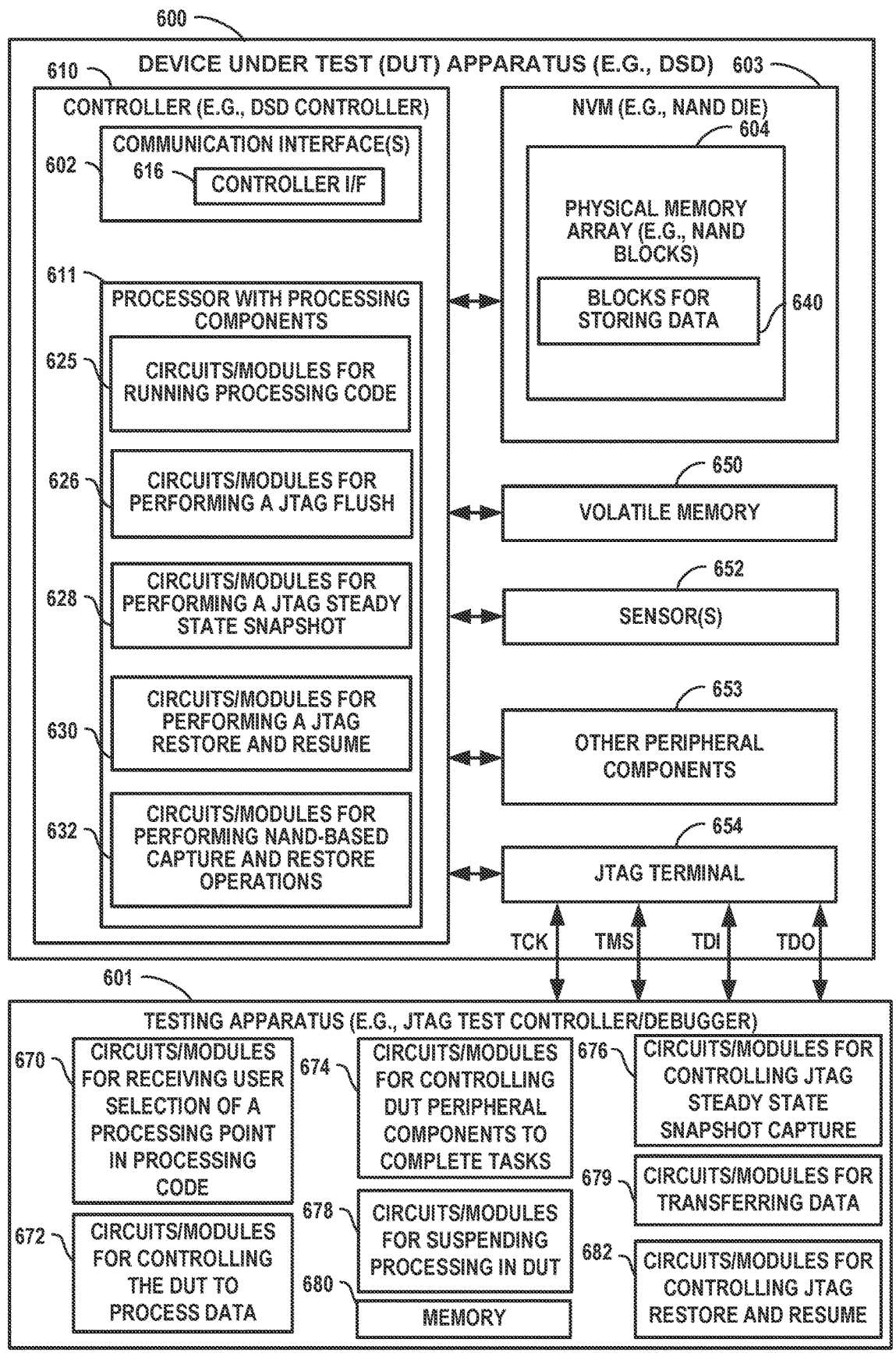
FIG. 6 is a schematic block diagram illustrating an exemplary test apparatus and an exemplary DUT, both configured in accordance with aspects of the disclosure.

FIG. 6 illustrates an embodiment of an exemplary DUT apparatus 600 configured according to one or more aspects of the disclosure along with an exemplary JTAG test controller/debugger 601. The DUT apparatus 600, or components thereof, could embody or be implemented within a data storage controller such as a DSD controller 610 coupled to a volatile memory 650, one or more sensors 652, various other peripheral components and a NAND die 603 or some other type of NVM array that supports data storage. Note that the communication interface 602 and the NVM die 603 may be regarded as peripheral components for the sake of the JTAG Steady State flush operations described above.

In various implementations, the DSD apparatus 600, or components thereof, could be a component of a processor, a controller, a computing device, a personal computer, a portable device, workstation, a server, a personal digital assistant, a digital camera, a digital phone, an entertainment device, a medical device, a self-driving vehicle control device, an edge device, or any other electronic device that stores, processes, or uses data. The JTAG test controller/debugger 601 may be detachably coupled to the DUT apparatus 600 for testing purposes via TCK, TMS, TDI, and TDO lines connected to a JTAG terminal 654. e.g., a TAP.

The DUT apparatus 600 includes a communication interface 602 and is coupled to a NVM 603 (e.g., a NAND die) and a volatile memory 650 (e.g., DRAM). The NVM 603 includes physical memory array 604. The communication interface 602 is further coupled to the one or more sensors 652 (such as temperature sensors). The various components of the DUT apparatus 600 can be coupled to and/or placed in electrical communication with one another via suitable components, represented generally by the connection lines in FIG. 6. Although not shown, other circuits such as timing sources, peripherals, voltage regulators, and power management circuits may be provided, which will not be described any further.

The communication interface 602 provides a means for communicating with other apparatuses, such as a host (not shown), over a transmission medium. In some implementations, the communication interface 602 includes circuitry and/or programming (e.g., a program) adapted to facilitate the communication of information bi-directionally with respect to one or more devices in a system. In some implementations, the communication interface 602 may be configured for wire-based communication. For example, the communication interface 602 could be a bus interface, a send/receive interface, or some other type of signal interface including circuitry for outputting and/or obtaining signals (e.g., outputting signal from and/or receiving signals into a DSD). In some examples, the JTAG controller 601 might be capable of emulating a host so that, during debugging, a separate host is not used.

The physical memory array 604 may include one or more NAND blocks 640. The physical memory array 604 may be accessed by the processing components 610. In one aspect, the volatile memory 650 may store instructions and other information to support the operation of the processing components 610.

The DUT apparatus 600 includes a processor with various processing components 611 arranged or configured to obtain, process and/or send data, control data access and storage, issue or respond to commands, and control other desired operations. For example, the processing components 611 may be implemented as one or more processors, one or more controllers, and/or other structures configured to perform functions. According to one or more aspects of the disclosure, the processing components 611 may be adapted to perform any or all of the features, processes, functions, operations and/or routines described herein that pertain to SSDs. For example, the processing components 611 may be configured to perform any of the steps, functions, and/or processes described with respect to FIGS. 1, 2, 3, 4, 5 and FIGS. 9 and 10 (described below) pertaining a DUT. As used herein, the term "adapted" in relation to processing components 611 or other components may refer to the components being one or more of configured, employed, implemented, and/or programmed to perform a particular process, function, operation and/or routine according to various features described herein. The circuits may include a specialized processor, such as an ASIC that serves as a means for (e.g., structure for) carrying out any one of the operations described, e.g., in conjunction with an exemplary device (such as an SSD to be tested via JTAG). The processing components 611 serve as an example of a means for processing. In various implementations, the processing components 611 may provide and/or incorporate, at least in part, functionality described above for the components of SSD controller 108 of FIG. 1 or controller 518 of FIG. 5.

The JTAG test controller/debugger 601 also includes various processing components arranged or configured to obtain, process and/or send data, control data access and storage, issue or respond to commands, and control other desired operations. For example, the processing components of the JTAG test controller/debugger 601 may be implemented as one or more processors, one or more controllers, and/or other structures configured to perform functions.

According to one or more aspects of the disclosure, the JTAG test controller/debugger 601 includes processing components, a processor, or a processing system including one or more of: a circuit/module 670 configured for receiving a user selection of a processing point within processing code, such as point within the processing code for insertion of the aforementioned JTAG_Snapshot_Flush_Process( ) instruction; a circuit/module 672 configured for controlling the DUT apparatus 600 to process data using its processor and its various peripheral components, such as by controlling the DUT to run processing code downloaded by the JTAG test controller 601 into the DUT apparatus 600; a circuit/module 674 configured for controlling the peripheral components (e.g., NVM 603, sensor(s) 652, and peripheral components 653) of the DUT apparatus 600 to complete their tasks; a circuit/module 676 configured for controlling the DUT peripheral components to flush all completed task data to the volatile memory 650 of the DUT to generate or capture a Steady State Snapshot in the memory 650; a circuit/module 678 configured for controlling the DUT to suspend (or halt, stop, or break) processing of the DUT (e.g., via use of a break command or instruction); a circuit/module 679 configured for controlling the DUT apparatus 600 to transfer the snapshot data to a memory 680 of the test apparatus 601; a circuit/module 682 configured for controlling the DUT apparatus 600 to perform a JTAG Restore and Resume, such as by loading the JTAG Steady State Snapshot data back into the various peripheral components of the DUT apparatus 600 and then resuming DUT operations beyond a previous break point in the processing code. Circuit/modules 676 and 682 may also control the aforementioned NAND-based operations. See, above, for descriptions of the special operations that may be employed to bypass NAND data capture or to at least make the capture more efficient using, for example, PCIe in conjunction with an external HDD (not shown in FIG. 6).

According to one or more aspects of the disclosure, the processing components of the test controller 601 may be adapted to perform any or all of the features, processes, functions, operations and/or routines described herein that pertain to test controllers. For example, the processing components may be configured to perform any of the steps, functions, and/or processes described with respect to FIGS. 1, 2, 3, 4, 5 and FIGS. 7 and 8 (described below) pertaining test controllers.

According to at least one example of the DUT apparatus, the processing components 611 of the DUT may include one or more of: a circuit/module 625 configured for running processing code, including compiled code with a user-selected break point; circuits/modules 626 configured for performing the JTAG Flush (under the control of the JTAG test controller 601); circuits/modules 628 configured for performing the JTAG Steady State Snapshot (under the control of the JTAG test controller 601); circuits/modules 630 configured for performing the JTAG Restore and Resume (under the control of the JTAG test controller 601); and circuits/modules 632 configured for performing the above described NAND-based operations (under the control of the JTAG test controller/debugger 601). Again, see above for descriptions of special operations that may be employed to bypass NAND data capture or to at least make the capture more efficient using, for example, PCIe in conjunction with an external HDD (not shown in FIG. 6). In examples where the processing components 611 of the DUT apparatus 600 include internal ASIC modules, support for Flush/Snapshot/Restore/Resume features may be provided within each ASIC module to facilitate saving and restoring ASIC module content. This may be done by an ASIC design team while the DUT is designed.

In at least some examples, means may be provided for performing the functions illustrated in FIG. 6 and/or other functions illustrated or described herein. For example, the means may include one or more of: means, such as circuit/module 670, for receiving an indication of a processing point within processor code for obtaining data from the DUT for use with a subsequent resume processing operation; means, such as circuit/module 672, for controlling a DUT to run the processor code using a control processor and perform a peripheral component task using a peripheral component; means, such as circuit/module 674, for controlling the DUT to complete the peripheral component task in response to the control processor of the DUT reaching the processing point in the processor code; means, such as circuit/module 676, for controlling the DUT to save completed peripheral component task data to a memory of the DUT; means, such as circuit/module 678, for suspending processing within the DUT, e.g., at a user-selected break point; means, such as circuit/module 679, for transferring the data from the memory of the DUT to the test controller to enable the test controller to perform the subsequent resume processing operation; means, such as circuit/module 682, for controlling a DUT apparatus to perform a JTAG Restore and Resume, such as by initializing the DUT to run in a normal processing mode, restoring the data obtained from the DUT into the DUT, and controlling the DUT to resume processing operations at or beyond the processing point using the restored data.

The means may also include one or more of: means, such circuit/module 625, for running processing code such as compiled code with a user-selected break point; means, such as circuits/modules 626, for performing the JTAG Flush operation described above; means, such as circuits/modules 628, for performing the JTAG Steady State Snapshot operation described above; means, such as circuits/modules 630, for performing the JTAG Restore and Resume operation described above; and means, such as circuits/modules 632, for controlling the NAND-based operations described above.

Additional Exemplary Apparatus

Figure 7:
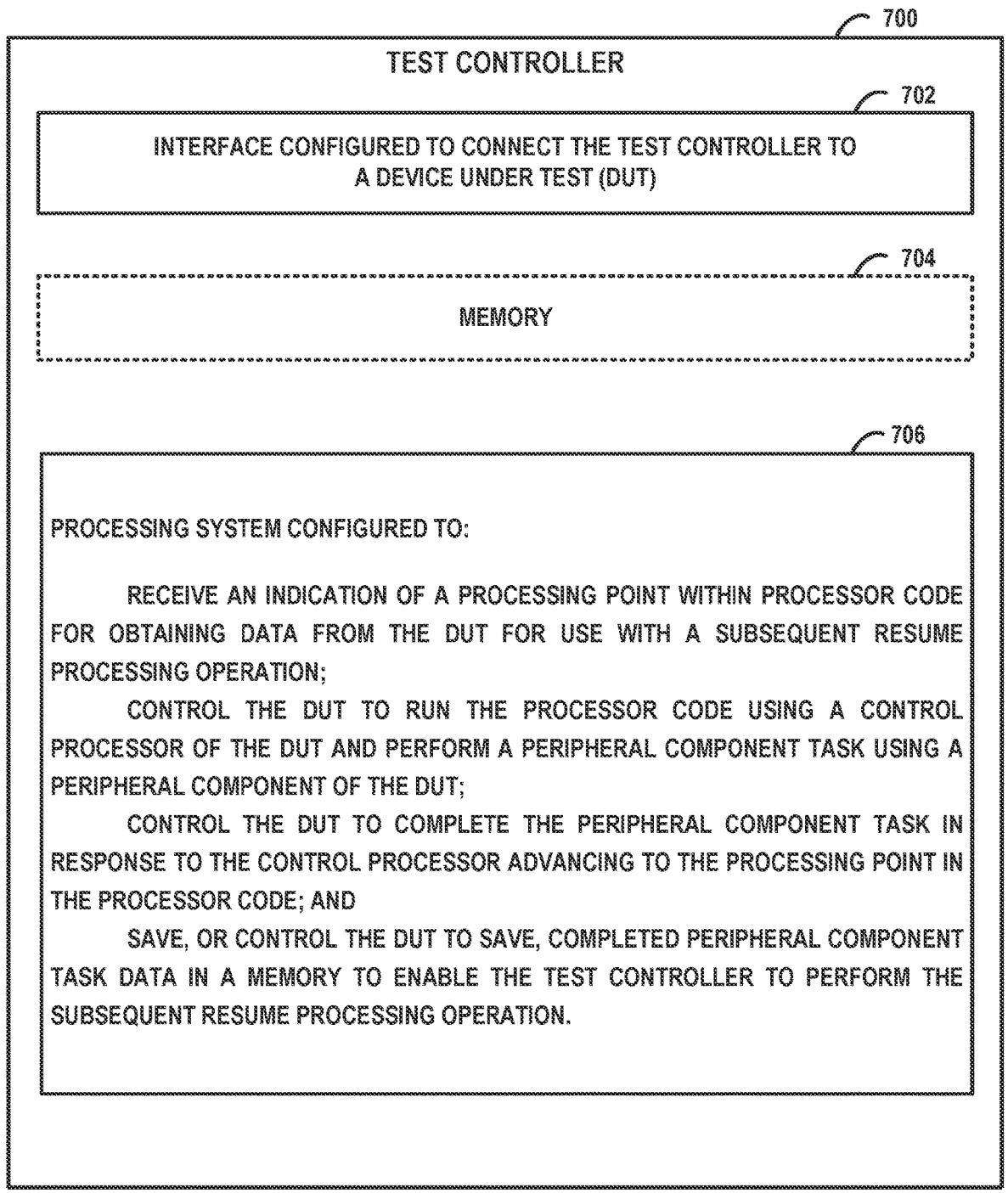
FIG. 7 is a schematic block diagram illustrating another exemplary test apparatus configured in accordance with aspects of the disclosure.

FIG. 7 broadly illustrates a test controller 700 configured according to one or more aspects of the disclosure. The test controller 700 includes: an interface 702 configured to connect the test controller to a DUT; an (optional) memory 704 and a processing system 706. The processing system is configured to: receive an indication (e.g., from a user) of a processing point within processor code for obtaining data from the DUT for use with a subsequent resume processing operation; control the DUT to run the processor code using a control processor of the DUT and perform a peripheral component task using a peripheral component of the DUT; control the DUT to complete the peripheral component task in response to the control processor reaching the processing point in the processor code; and save, or control the DUT to save, completed peripheral component task data in a memory to enable test controller to perform the subsequent resume processing operation. For example, the processing system may be configured to control the DUT to save completed peripheral component task data in a memory of the DUT and then transfer the peripheral component task data from the memory of the DUT to a memory of the test controller to enable the test controller to perform the subsequent resume processing operation.

In some aspects, the processing point is the point in the code into which the user inserts the above-described JTAG_Snapshot_Flush_Process( ) instruction. Thus, in some aspects, the test controller controls the DUT to complete the peripheral component task in response to the control processor reaching the processing point in the processor code by loading program code into the DUT with the JTAG_Snapshot_Flush_Process( ) instruction (and associated code), which causes the processor of the DUT to control the various peripheral components to complete their tasks. The JTAG_Snapshot_Flush_Process( ) instruction also invokes the above-described code that specifies where to write the data being captured and which values to set within registers, including a Program Counter register of the main code processor of the DUT. Accordingly, in some aspects, loading the program code into the DUT with the JTAG_Snapshot_Flush_Process( ) instruction also serves to control the DUT to save the completed peripheral component task data in a memory of the DUT. In some aspects, the transfer of the flushed data occurs following a user-selected break( ) point. In some aspects, the processing system of the test controller is further configured to perform the subsequent resume processing operation by: initializing the DUT to run in a normal processing mode; restoring the data obtained from the DUT into the same or a different DUT; and control the DUT to resume processing at or beyond the processing point using the restored data. For example, processing may resume just beyond the aforementioned break point, as described above.

In other examples, rather than loading code into the DUT that includes instructions to control the DUT to perform the operations, commands or messages instead may be sent by the test controller to the DUT via UART or other suitable interfaces (e.g., PCIe). See, again, FIG. 5.

Figure 8:
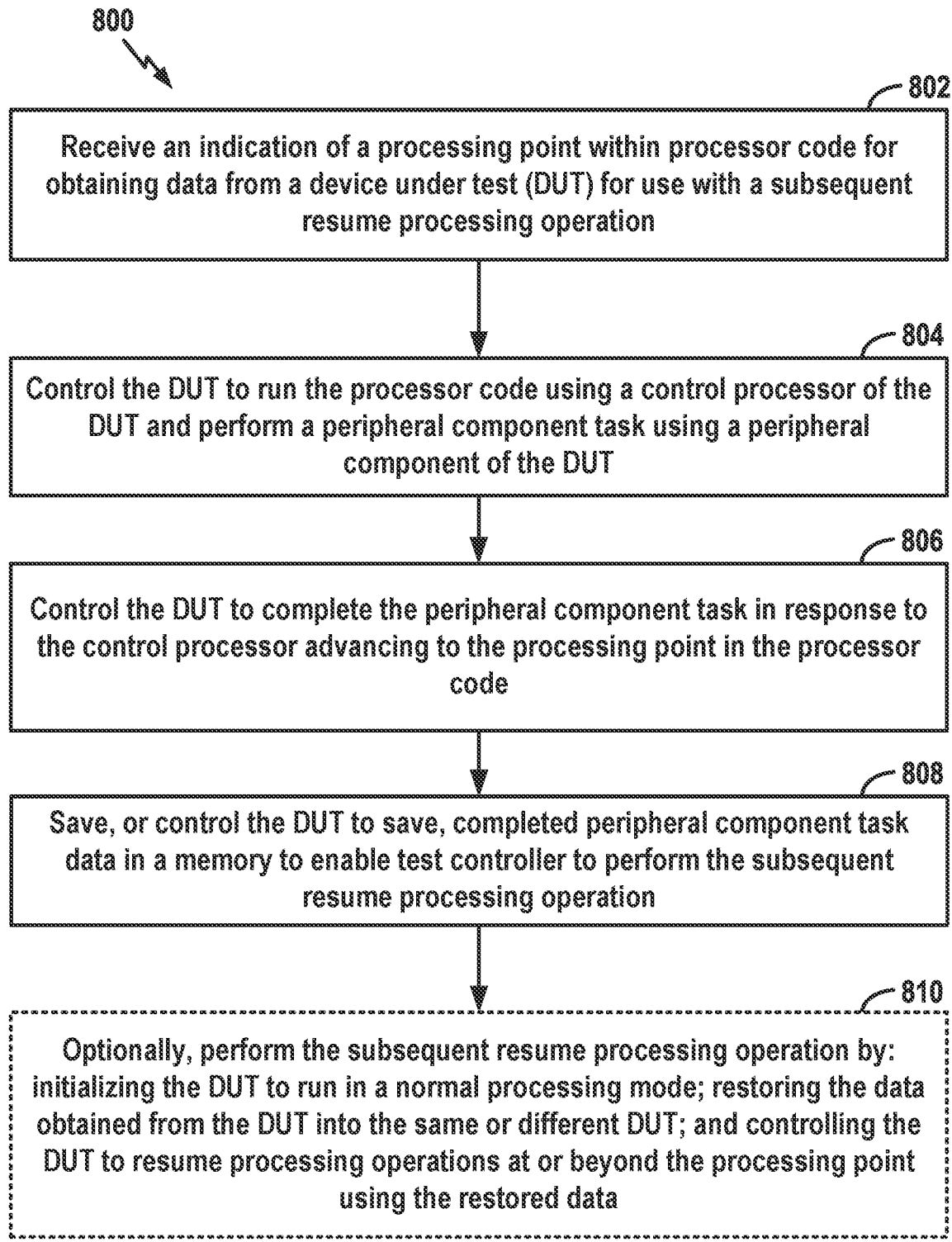
FIG. 8 is a flowchart illustrating a method or procedure for use by a test controller in accordance with some aspects of the disclosure.

FIG. 8 broadly illustrates a method 800 according to one or more aspects of the disclosure for use by a test controller. At block 802, the test controller receives an indication of a processing point within processor code for obtaining data from a DUT for use with a subsequent resume processing operation. In some aspects, the processing point is the point in the code into which the user inserts the above-described JTAG_Snapshot_Flush_Process( ) instruction. At block 804, the test controller controls the DUT to run the processor code using a control processor of the DUT and perform a peripheral component task using a peripheral component of the DUT. At block 806, the test controller controls the DUT to complete the peripheral component task in response to the control processor reaching the processing point in the processor code (e.g., the JTAG_Snapshot_Flush_Process( ) instruction). At block 808, the test controller saves, or controls the DUT to save, completed peripheral component task data in a memory to enable test controller to perform the subsequent resume processing operation. For example, the test controller may control the DUT to save the completed peripheral component task data to a memory of the DUT and then transfer the peripheral component task data from the memory of the DUT to the test controller to enable the test controller to perform the subsequent resume processing operation (e.g., using a JTAG readmem command). In some aspects, the transfer of data is performed following a user-selected break point in the processing code. Optionally, at block 810, the test controller performs the subsequent resume processing operation by: initializing the DUT to run in a normal processing mode; restoring the data obtained from the DUT into the same or different DUT (e.g., using a JTAG writemem command); and controlling the DUT to resume processing operations at or beyond the processing point using the restored data. In other examples, rather than loading code into the DUT that includes instructions to control the DUT to perform flush/snapshot operations (e.g., the JTAG_Snapshot_Flush_Process( ) instruction), commands or messages instead may be sent by the test controller to the DUT via a UART or other suitable interface (e.g., PCIe). See, again, FIG. 5. In an example where commands or messages are sent to the DUT, each of blocks 804, 806, 808, and 810 may be a separate command or message.

Figure 9:
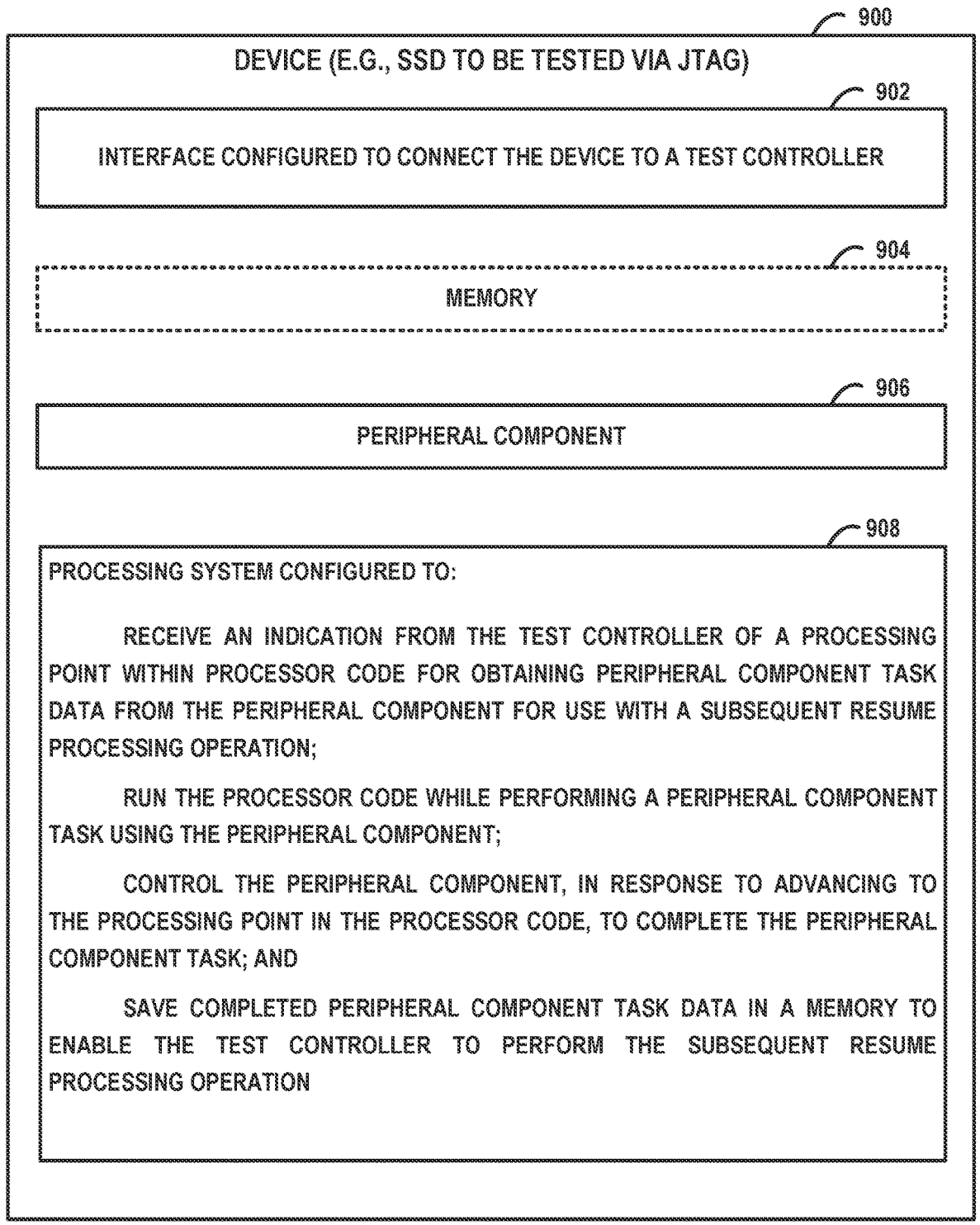
FIG. 9 is a schematic block diagram illustrating an exemplary device (such as an SSD to be tested via JTAG) that is configured in accordance with aspects of the disclosure.

FIG. 9 broadly illustrates a device 900 (such as an SSD to be tested via JTAG) configured according to one or more aspects of the disclosure. The device 900 includes: an interface 902 configured to connect the device to a test controller (such as a JTAG debugger); an (optional) memory 904; at least one peripheral component 906, and a processor 908. The processor 908 is configured to: receive an indication from the test controller of a processing point within processor code for obtaining peripheral component task data from the peripheral component for use with a subsequent resume processing operation, run the processor code while performing a peripheral component task using the peripheral component; control the peripheral component, in response to advancing to (or reaching) the processing point in the processor code, to complete the peripheral component task; and save completed peripheral component task data in a memory to enable the test controller to perform the subsequent resume processing operation. In an example where there is a set of peripheral components, the processing system may be configured to: process data in conjunction with the peripheral components, with the processing system running the processor code and the peripheral components performing peripheral component tasks; upon advancing to (or reaching) a steady state flush instruction in the processor code, collect data for use with a subsequent resume processing operation by controlling the peripheral components to complete their tasks and save completed task data to a memory; and then transfer the data from the memory to the test controller to enable the test controller to initiate the subsequent resume processing operation. The steady state flush instruction may be, for example, the above-described JTAG_Snapshot_Flush_Process( ) instruction.

Figure 10:
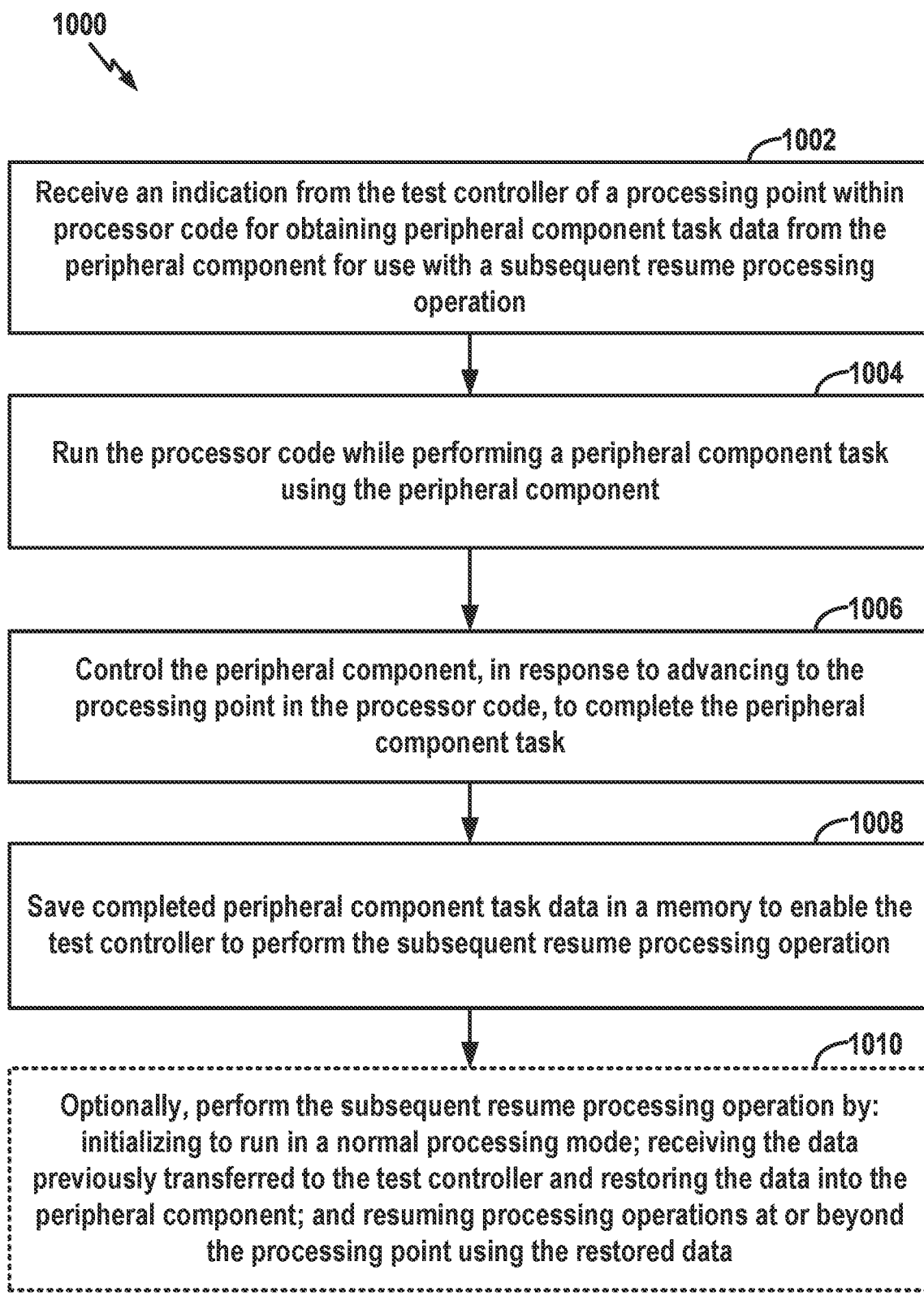
FIG. 10 is a flowchart illustrating a method or procedure for use by a device (such as an SSD to be tested via JTAG) in accordance with some aspects of the disclosure.

FIG. 10 broadly illustrates a method 1000 according to one or more aspects of the disclosure for performing by a device (such as an SSD to be tested via JTAG). At block 1002, the device (which may be a DUT) receives an indication from the test controller of a processing point within processor code for obtaining peripheral component task data from the peripheral component for use with a subsequent resume processing operation. At block 1004, the device runs the processor code while performing a peripheral component task using the peripheral component. At block 1006, in response to advancing to (or reaching) the processing point in the processor code, the device controls the peripheral component to complete the peripheral component task. At block 1008, the device saves completed peripheral component task data in a memory to enable the test controller to perform the subsequent resume processing operation. Optionally, at block 1010, the device performs the subsequent resume processing operation by: initializing to run in a normal processing mode; receiving data previously transferred to the test controller and restoring the data into the peripheral component; and then resuming processing operations at or beyond the processing point using the restored data.

In an example where the device has a set of peripheral components, the device may process data using a control processor of the device and the set of peripheral components, with the control processor running processor code and the peripheral components performing peripheral component tasks. Upon advancing to (or reaching) a steady state flush instruction in the processor code, the device may collect data for use with a subsequent resume processing operation by controlling the peripheral components to complete their tasks and save completed task data to the memory. The steady state flush instruction may be, for example, the above-described JTAG_Snapshot_Flush_Process( ) instruction. The device may then transfer the data from the memory to the test controller to enable the test controller to initiate the subsequent resume processing operation. The device may then perform the subsequent resume processing operation by: initializing to run in a normal processing mode, receiving the data previously transferred to the test controller and restoring the data into the peripheral components; and then resuming processing operations at or beyond the processing point using the restored data.

Additional Aspects

At least some of the processing circuits described herein may be generally adapted for processing, including the execution of programming code stored on a storage medium. As used herein, the terms "code" or "programming" shall be construed broadly to include without limitation instructions, instruction sets, data, code, code segments, program code, programs, programming, subprograms, software modules, applications, software applications, software packages, routines, subroutines, objects, executables, threads of execution, procedures, functions, etc., whether referred to as software, firmware, middleware, microcode, hardware description language, or otherwise. As used herein, the terms "run" or "runs" as used in conjunction with actions a DUT or processor performs, shall be construed broadly to mean that the respective component executes the respective action.

At least some of the processing circuits described herein may be arranged to obtain, process and/or send data, control data access and storage, issue commands, and control other desired operations. The processing circuits may include circuitry configured to implement desired programming provided by appropriate media in at least one example. For example, the processing circuits may be implemented as one or more processors, one or more controllers, and/or other structure configured to execute executable programming. Examples of processing circuits may include a general purpose processor, a digital signal processor (DSP), an ASIC, a field programmable gate array (FPGA) or other programmable logic component, discrete gate or transistor logic, discrete hardware components, or any combination thereof designed to perform the functions described herein. A general purpose processor may include a microprocessor, as well as any conventional processor, controller, microcontroller, or state machine. At least some of the processing circuits may also be implemented as a combination of computing components, such as a combination of a controller and a microprocessor, a number of microprocessors, one or more microprocessors in conjunction with an ASIC and a microprocessor, or any other number of varying configurations. The various examples of processing circuits noted herein are for illustration and other suitable configurations within the scope of the disclosure are also contemplated.

Aspects of the subject matter described herein can be implemented in any suitable NVM, including NAND flash memory such as 3D NAND flash memory. More generally, semiconductor memory devices include working memory devices, such as DRAM or SRAM devices, NVM devices, ReRAM, EEPROM, flash memory (which can also be considered a subset of EEPROM), ferroelectric random access memory (FRAM), and MRAM, and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured. The semiconductor memory elements located within and/or over a substrate may be arranged in two or three dimensions, such as a two-dimensional memory structure or a three-dimensional memory structure.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements. One of skill in the art will recognize that the subject matter described herein is not limited to the two-dimensional and three-dimensional exemplary structures described but cover all relevant memory structures within the spirit and scope of the subject matter as described herein and as understood by one of skill in the art.

The examples set forth herein are provided to illustrate certain concepts of the disclosure. The apparatus, devices, or components illustrated above may be configured to perform one or more of the methods, features, or steps described herein. Those of ordinary skill in the art will comprehend that these are merely illustrative in nature, and other examples may fall within the scope of the disclosure and the appended claims. Based on the teachings herein those skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Aspects of the present disclosure have been described above with reference to schematic flowchart diagrams and/or schematic block diagrams of methods, apparatus, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

The subject matter described herein may be implemented in hardware, software, firmware, or any combination thereof. As such, the terms "function," "module," and the like as used herein may refer to hardware, which may also include software and/or firmware components, for implementing the feature being described. In one example implementation, the subject matter described herein may be implemented using a computer readable medium having stored thereon computer executable instructions that when executed by a computer (e.g., a processor) control the computer to perform the functionality described herein. Examples of computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

The various features and processes described above may be used independently of one another, or may be combined in various ways. All possible combinations and sub-combinations are intended to fall within the scope of this disclosure. In addition, certain method, event, state, or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner. Tasks or events may be added to or removed from the disclosed example embodiments. The example systems and components described herein may be configured differently than described. For example, elements may be added to, removed from, or rearranged compared to the disclosed example embodiments.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The word "exemplary" is used herein to mean "serving as an example, instance, or illustration." Any aspect described herein as "exemplary" is not necessarily to be construed as preferred or advantageous over other aspects. Likewise, the term "aspects" does not require that all aspects include the discussed feature, advantage, or mode of operation.

While the above descriptions contain many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents. Moreover, reference throughout this specification to "one embodiment," "an embodiment," "in one aspect," or similar language means that a particular feature, structure, or characteristic described in connection with the embodiment is included in at least one embodiment of the present disclosure. Thus, appearances of the phrases "in one embodiment," "in an embodiment," "in one aspect," and similar language throughout this specification may, but do not necessarily, all refer to the same embodiment, but mean "one or more but not all embodiments" unless expressly specified otherwise.

The terminology used herein is for the purpose of describing particular aspects only and is not intended to be limiting of the aspects. As used herein, the singular forms "a," "an" and "the" are intended to include the plural forms as well (i.e., one or more), unless the context clearly indicates otherwise. An enumerated listing of items does not imply that any or all of the items are mutually exclusive and/or mutually inclusive, unless expressly specified otherwise. It will be further understood that the terms "comprises," "comprising," "includes" "including," "having," and variations thereof when used herein mean "including but not limited to" unless expressly specified otherwise. That is, these terms may specify the presence of stated features, integers, steps, operations, elements, or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

Any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be used there or that the first element must precede the second element in some manner. Also, unless stated otherwise a set of elements may include one or more elements. In addition, terminology of the form "at least one of A, B, or C" or "A, B, C, or any combination thereof" or "one or more of A, B, or C" used in the description or the claims means "A or B or C or any combination of these elements." For example, this terminology may include A, or B, or C, or A and B, or A and C, or A and B and C, or 2A, or 2B, or 2C, or 2A and B, and so on. As a further example, "at least one of: A, B, or C" or "one or more of A, B, or C" is intended to cover A, B, C, A-B, A-C, B-C, and A-B-C, as well as multiples of the same members (e.g., any lists that include AA, BB, or CC). Likewise, "at least one of: A, B, and C" or "one or more of A, B, or C" is intended to cover A, B, C, A-B, A-C, B-C, and A-B-C, as well as multiples of the same members. Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

As used herein, the term "determining" encompasses a wide variety of actions. For example, "determining" may include calculating, computing, processing, deriving, investigating, looking up (e.g., looking up in a table, a datastore, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

What is claimed is:

1. A test controller comprising:
    an interface configured to connect the test controller to a device under test (DUT); and
    a processing system coupled to the interface and configured to:

receive an indication of a processing point within processor code for obtaining data from the DUT for use with a subsequent resume processing operation;

control the DUT to run the processor code using a control processor of the DUT and perform a peripheral component task using a peripheral component of the DUT;

control the DUT to complete the peripheral component task in response to the control processor advancing to the processing point in the processor code; and save, or control the DUT to save, completed peripheral component task data in a memory to enable the test controller to perform the subsequent resume processing operation.

2. The test controller of claim 1, wherein the processing system is further configured to receive the indication of the processing point from a user of the test controller.

3. The test controller of claim 1, wherein the peripheral component is one of a plurality of peripheral components of the DUT, each configured to perform a peripheral component task, and wherein the processing system is further configured to control the DUT to complete all peripheral component tasks of the plurality of peripheral components and save all completed peripheral component task data in the memory.

4. The test controller of claim 1, wherein the processing system is further configured to control the peripheral component of the DUT to complete the peripheral component task by being further configured to control the peripheral component to process all pending peripheral component commands to reach a steady state.

5. The test controller of claim 4, wherein the peripheral component includes a command queue and wherein the processing system is further configured to control the peripheral component to process pending peripheral component commands to reach the steady state by being configured to control the peripheral component to process all pending commands in its command queue.

6. The test controller of claim 4, wherein the peripheral component commands comprise one or more of: tasks issued by the control processor of the DUT; and messages received by the DUT from an external device.

7. The test controller of claim 1, wherein the processing system is further configured to control the peripheral component to output its completed peripheral component task data to the memory by being configured to apply a flush command to the peripheral component.

8. The test controller of claim 1, wherein the DUT is configured for use with Joint Test Action Group (JTAG) test protocols, and wherein the processing system further is configured to apply JTAG control signals to the DUT to transfer the data to the test controller.

9. The test controller of claim 1, wherein the memory is configured to store processing state data representative of a processing state of the control processor of the DUT, and wherein the processing system is further configured to obtain the processing state data from the memory to further enable the subsequent resume processing operation.

10. The test controller of claim 1, wherein the processing system is further configured to process completed peripheral component task data obtained from the DUT as part of a debug procedure.

11. The test controller of claim 1, wherein the processing system is further configured to perform the subsequent resume processing operation by being configured to:

initialize the DUT to run in a normal processing mode;

restore completed peripheral component task data obtained from the DUT into the same DUT; and control the DUT to resume processing at the processing point using the restored data.

12. The test controller of claim 1, wherein the DUT is a first DUT and the processing system is further configured to resume the processing operations within a second DUT.

13. The test controller of claim 12, wherein the first DUT and the second DUT both comprise a data storage device (DSD) with a non-volatile memory (NVM), and wherein the processing system is further configured to transfer all data stored within the NVM of the first DUT to an external memory and then transfer the data to the NVM of the second DUT.

14. A method for use by a test controller, the method comprising:

receiving an indication of a processing point within processor code for obtaining data from a device under test (DUT) for use with a subsequent resume processing operation;

controlling the DUT to run the processor code using a control processor of the DUT and perform a peripheral component task using a peripheral component of the DUT;

controlling the DUT to complete the peripheral component task in response to the control processor advancing to the processing point in the processor code; and saving, or controlling the DUT to save, completed peripheral component task data in a memory to enable the test controller to perform the subsequent resume processing operation.

15. The method of claim 14, wherein the peripheral component is one of a plurality of peripheral components of the DUT, each configured to perform a peripheral component task, and wherein the DUT is controlled to complete all peripheral component tasks and save all completed peripheral component task data in the memory.

16. The method of claim 14, wherein controlling the peripheral component of the DUT to complete its task comprises controlling the peripheral component to process pending commands to reach a steady state, and wherein the commands comprise one or more of: tasks issued by the control processor of the DUT; and messages received by the DUT from an external device.

17. The method of claim 14, wherein the memory also stores processing state data representative of a processing state of the control processor of the DUT, and wherein the method further comprises transferring the processing state data from the memory to the test controller to further enable the subsequent resume operation.

18. The method of claim 14, further comprising performing the subsequent resume processing operation by:

initializing the DUT to run in a normal processing mode;

restoring completed peripheral component task data obtained from the DUT into the DUT; and controlling the DUT to resume processing operations at the processing point using the restored data.

19. The method of claim 14, wherein the subsequent resume processing operation is performed using a different DUT than the DUT from which the data was obtained.

20. An apparatus comprising:

means for receiving an indication of a processing point within processor code for obtaining data from a device under test (DUT) for use with a subsequent resume processing operation;

means for controlling the DUT to run the processor code using a control processor of the DUT and perform a peripheral component task using a peripheral component of the DUT;

means for controlling the DUT to complete the peripheral component task in response to the control processor advancing to the processing point in the processor code; and means for saving, or controlling the DUT to save, completed peripheral component task data in a memory to enable the apparatus to perform the subsequent resume processing operation.

21. A device comprising:

an interface configured to connect the device to a test controller;

a peripheral component; and a processing system coupled to the interface and configured to:

receive an indication from the test controller of a processing point within processor code for obtaining peripheral component task data from the peripheral component for use with a subsequent resume processing operation;

run the processor code while performing a peripheral component task using the peripheral component;

control the peripheral component, in response to advancing to the processing point in the processor code, to complete the peripheral component task; and save completed peripheral component task data in a memory to enable the test controller to perform the subsequent resume processing operation.

* * * * *